United States Patent [19]

Blitchington et al.

[11] 4,109,158
[45] Aug. 22, 1978

[54] APPARATUS FOR POSITIONING A PAIR OF ELEMENTS INTO ALIGNED INTIMATE CONTACT

[75] Inventors: Frank Henning Blitchington; George David Hudson, both of Richmond, Va.

[73] Assignee: Western Electric Company, Inc., New York, N.Y.

[21] Appl. No.: 691,043

[22] Filed: May 27, 1976

[51] Int. Cl.² .............................................. G01N 21/30
[52] U.S. Cl. ..................................... 250/548; 356/172
[58] Field of Search ............... 356/172, 144, 153, 152; 250/548, 557; 29/72 Q, 760

[56] References Cited

U.S. PATENT DOCUMENTS

| | | | |
|---|---|---|---|
| 3,843,916 | 10/1974 | Trotel et al. | 356/172 |
| 3,890,508 | 6/1975 | Sharp | 250/548 |
| 3,955,072 | 5/1976 | Johannsmeier et al. | 356/172 |

*Primary Examiner*—David C. Nelms
*Attorney, Agent, or Firm*—J. B. Hoofnagle, Jr.

[57] ABSTRACT

A continuous flexible web includes a flat flexible insulation substrate, copper cladding on at least one major surface of the substrate and a film of photoresist material adhesively bonded longitudinally to the copper cladding. Prepunched holes are formed in and through the web to ultimately provide through-hole connections between printed circuits formed on opposite sides of the substrate.

Successive sections of the web are indexed through an apparatus where the sections are positioned adjacent to a circuit pattern master and exposed to resist-developing ultraviolet rays. A photocell system cooperates with through-slots formed selectively in the web to precisely align the web sections with the circuit pattern master prior to exposure to the ultraviolet rays.

18 Claims, 25 Drawing Figures

APPARATUS FOR POSITIONING A PAIR OF ELEMENTS INTO ALIGNED INTIMATE CONTACT

BACKGROUND OF THE INVENTION

1. Field of the Invention

This invention relates to an apparatus for positioning a pair of elements into aligned intimate contact. Particularly, this invention relates to apparatus for a precise photocell-controlled positioning a resist-film covered, copper clad, flexible web adjacent to a pattern master for exposure to ultraviolet rays.

2. Description of the Prior Art

One method of manufacturing flexible printed circuits includes the screen printing, in ink, of circuit patterns directly onto a surface of copper cladding of successive sections of a flexible web with land areas of the inked patterns desirably located about positions whereat holes will be subsequently punched in the cladding and through the web. Thereafter, those portions of the copper cladding which are not covered by the ink are removed in an etching process. The ink is then removed from the remaining copper cladding and additional copper is deposited onto the now-exposed cladding, onto the walls of the now punched holes and, if desired, onto similarly formed circuit patterns of copper cladding on the opposite side of the flexible web.

To facilitate the screen printing process, a series of through slots are placed in spaced relation in each of successive sections of the flexible web along one margin thereof in a precise relationship to the positions whereat holes will be punched through the web. In addition, window openings are formed in the screen in precise relationship to circuit patterns in the screen and are designed to coincide with the through slots of the flexible web when the screen and successive web sections are aligned.

A light source is positioned adjacent to the window openings in the screen and, but for the presence of the flexible web, would normally direct light rays onto light sensitive devices, such as photo-diodes. The light sensitive devices are connected to a control system to assist in the control of a pair of web feed drums, at entrance and exit locations to the screen, which cooperate to accurately position the flexible web under the screen and, further, to control a screen positioning mechanism to accurately position the screen pattern relative to the flexible web.

In operation, successive sections of the flexible web are indexed adjacent to the screen and each section is accurately aligned with the screen for the screen printing operation. As each section of the flexible web is indexed into a position adjacent to the screen, a first of the slots in the web passes a window opening in the screen whereby one of the light sensitive devices is activated to facilitate the slowing of the feed of the web. Thereafter, the same slot in the flexible web is positioned for alignment with a corresponding window opening in the screen pattern. When the slot and window opening are generally aligned, another of the light sensitive devices responds and develops a voltage which controls the synchronous operation of the feed drums to accurately align the slot and window opening so that the section of the flexible web is aligned accurately in the longitudinal direction with the screen pattern.

As the first slot is positioned for alignment with the corresponding window opening, two other slots in the flexible web are also positioned to be aligned with corresponding window openings in the screen. When these slots and window openings are generally aligned, corresponding light sensitive devices respond to develop voltages which provide for the movement of a support for the screen to precisely align the two other slots and corresponding window openings and thereby provide for the precise lateral alignment of the screen pattern with the section of the flexible web.

After the two-direction alignment is accomplished, a table which is positioned adjacent to the web on the side opposite from the screen, vacuum grips the section of the flexible web and moves the web section to a spaced position beneath the screen. Thereafter, ink is deposited onto the screen and subsequently wiped through the pattern and onto the copper cladding of the web.

A reverse procedure is initiated to release the gripped web section and the next successive section of the web is then moved to align the next successive section with the screen pattern for the next ink printing operation.

Another technique for manufacturing flexible printed circuits includes the placement of a photoresist material on the copper cladding, the placing of a circuit pattern master adjacent to the photoresist material and the subsequent exposure of the uncovered photoresist material to ultraviolet rays whereby the exposed material is developed. Thereafter, the undeveloped photoresist material is removed to expose the underlying copper cladding.

In a first example, if the underlying exposed copper cladding is in the pattern of the ultimately formed circuit, additional copper is plated onto the exposed cladding and a protective solder coating is then applied to the plated copper. Thereafter, the exposed photoresist material is removed and the underlying copper cladding is removed whereby the desired printed circuit remains.

In a second example, if the underlying exposed copper cladding is in areas other than that ultimately occupied by the printed circuit, the exposed cladding is then removed by an etching process leaving only the copper cladding covered by the unexposed photoresist material. Subsequently, the unexposed photoresist material is removed to reveal the copper cladding in the pattern of the circuit pattern master. Subsequent copper plating and solder coating operations provide for a copper build-up and protective coating in the configuration of the circuit pattern.

SUMMARY OF THE INVENTION

The present invention contemplates an apparatus for precisely positioning a first element adjacent to a second element. The apparatus includes means for sealing interfacing engaged portions of the first and second elements in an airtight enclosure with the material and the element being in intimate contact within the airtight enclosure.

More specifically, the apparatus includes a positioning system for locating a flexible web having copper cladding on at least one surface and a photoresist material on the copper cladding. The flexible web is positioned adjacent to a circuit pattern master and is sealed in an airtight enclosure in interfacing engagement with the pattern master. Thereafter, the interfacing portions of the pattern master and the flexible web within the air-tight enclosure are urged into intimate contact.

DETAILED DESCRIPTION

Figure 1:
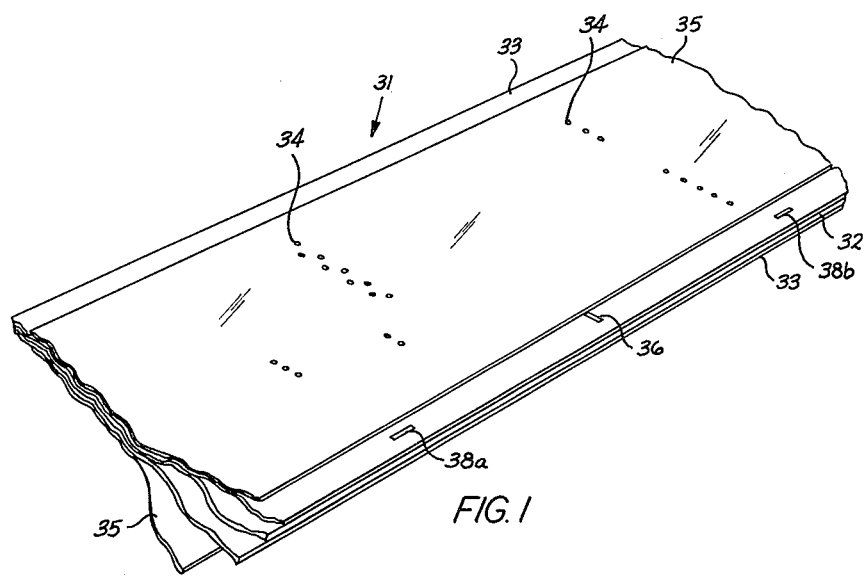
FIG. 1 is a partial perspective view of a section of a flexible web showing an insulating substrate supporting copper cladding with photoresist film material placed thereon.

Referring now to FIG. 1, there is illustrated a section of a continuous length of flexible web, designated generally by the numeral 31, which includes a flexible substrate 32 composed of insulating material and copper claddings 33 bonded to opposite major surfaces of the substrate. A plurality of precisely located, prepunched through holes 34 are formed through the flexible web 31 and ultimately facilitate support of copper throughconnections for printed circuits on opposite sides of the substrate 32. Film 35 of photoresist material is adhesively bonded to each of the copper claddings 33 on opposite sides of the flexible web 31 and are centered on the web so that marginal portions of the copper claddings are exposed. In addition, the flexible web 31 has a first through slot 36 formed therethrough near one margin of the web with the longitudinal dimension of the slot extending in a direction from side-to-side of the web. A set of through slots 38a and 38b are located near the same margin of the web 31 on opposite sides of the slot 36 and extend longitudinally of the web. It is to be noted that the slots 36, 38a and 38b are located precisely with respect to the prepunched holes 34.

Figure 2:
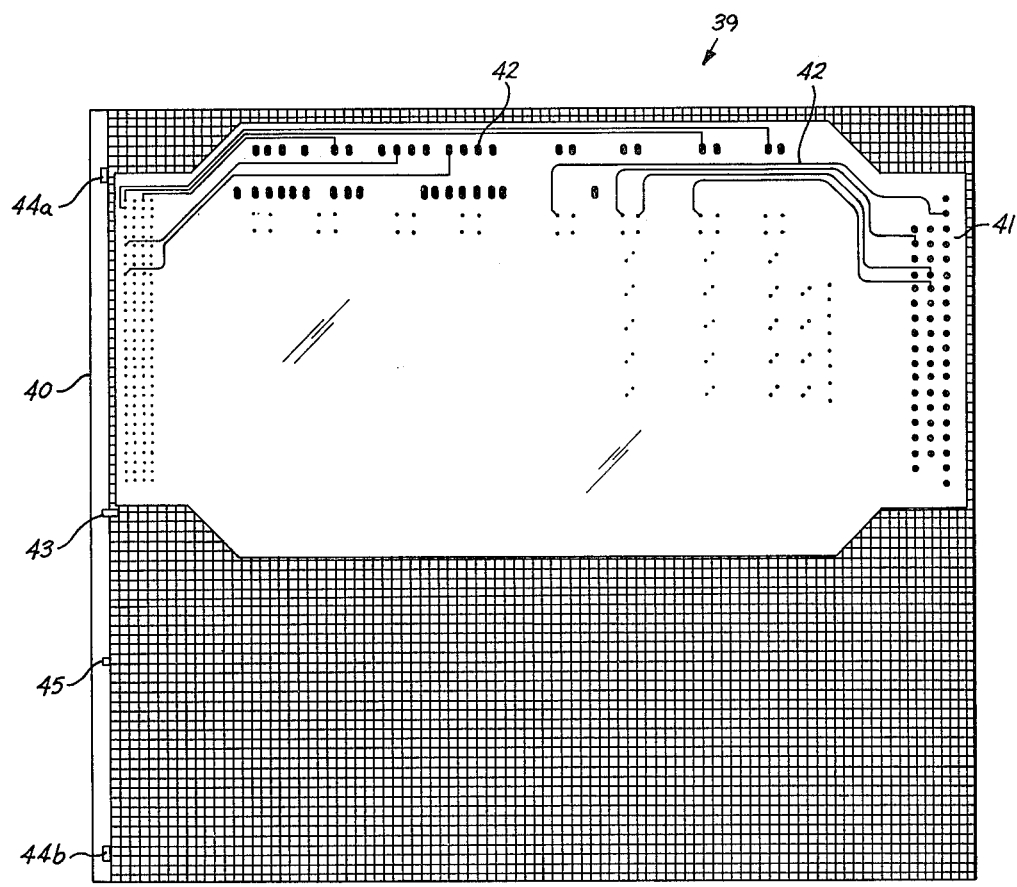
FIG. 2 is a plan view showing a printed circuit pattern master.

Referring now to FIG. 2, there is illustrated a printed circuit pattern master, designated generally by the numeral 39, which includes a glass or flexible transparent plastic substrate 41 having an art detail 42 positioned on the substrate to form desired circuit patterns. In addition, the pattern master 39 includes a first window 43 located adjacent to one edge 40 thereof with its longitudinal dimension extending in a direction from side-to-side of the pattern master. Additional windows 44a and 44b are formed in the pattern master 39 adjacent to the edge 40 and in spaced relation to the window 43 and extend in a direction longitudinally of the pattern master. Another window 45 is formed in the pattern master adjacent to the edge 40 and between the windows 43 and 44b.

In the manufacture of flexible printed circuits, the printed circuit pattern master 39 (FIG. 2) is selectively positioned over the film 35 of photoresist material on one side of the flexible web 31 so that the window 43 of the pattern master is aligned with the through slot 36 of the flexible web. In addition, the windows 44a and 44b of the pattern master 39 are aligned with the through slots 38a and 38b of the flexible web 31. Thereafter, the assembled pattern master 39 and the adjacent portions of the flexible web 31 are exposed to ultraviolet rays which results in the development of the photoresist material not covered by the art detail 42 of the pattern master. Therefore, those portions of the film 35 of photoresist material which are covered by the art detail 42 of the pattern master 39 are not developed.

Subsequently, the flexible web 31 is processed through a bath whereat the undeveloped photoresist material is removed from the web to expose the copper cladding 33 therebeneath in the circuit pattern. The flexible web 31 is then passed through a copper plating bath whereat copper is plated to a desired thickness onto the new exposed copper cladding 33 in the circuit pattern and onto the walls of the prepunched holes 34. A solder coating is then applied to the plated copper to provide a protective coating for the plated copper in the circuit path. Thereafter the developed photoresist material is removed to expose the underlying copper cladding 33 which is then removed in an etching process thereby leaving the solder-coated copper in the circuit pattern consistent with the art detail 42 of the pattern master 39.

While the foregoing description relates to one section of one side of the flexible web 31, it is to be understood that many circuits are similarly developed on both sides of the flexible web by selectively positioning successive sections of both sides of the web adjacent to related pattern masters 39. Therefore, in order to accomplish this selected exposure process for successive sections of both sides of the flexible web 31, each of the successive sections must contain a pattern of slots 36, 38a and 38b.

GENERAL DESCRIPTION OF APPARATUS

Figure 3:
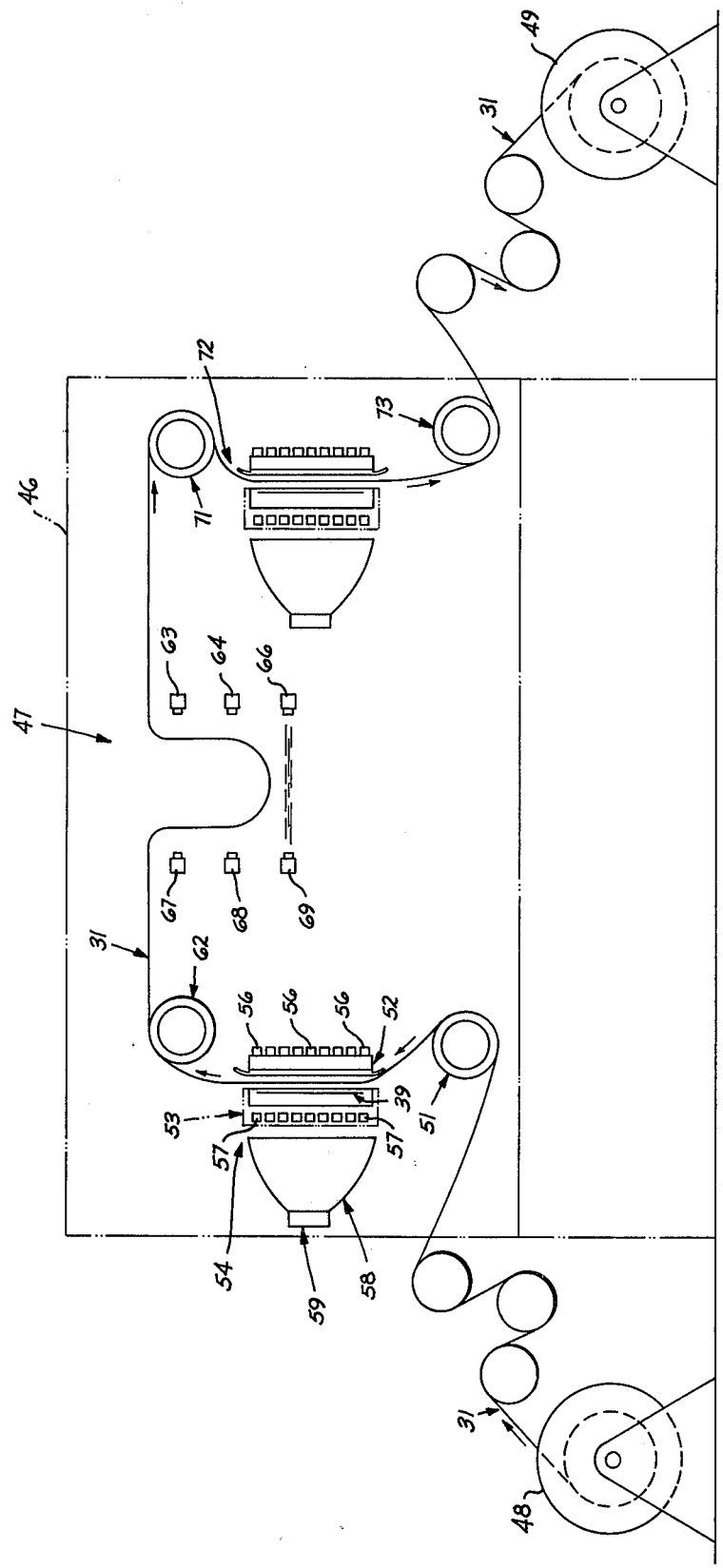
FIG. 3 is a schematic view showing generally the processing of the flexible web of FIG. 1 through a material processing and exposure apparatus in accordance with certain principles of the invention.

Referring now to FIG. 3, there is illustrated, in phantom, a housing 46 which contains an apparatus, designated generally by the numeral 47, for selectively positioning successive sections of both sides of the flexible web 31 for ultraviolet ray exposure as previously described.

A supply reel 48 containing a continuous length of the flexible web 31 is positioned to the left of the housing 46 and a takeup reel 49 is positioned to the right of the housing. The flexible web 31 is drawn from the supply reel 48 and is passed partially about a vacuum gripping, in-feed drum designated generally by the numeral 51. The flexible web 31 is then passed between a vacuum gripping table, designated generally by the numeral 52, and a support frame, designated generally by the numeral 53, at a first exposure station designated generally by the numeral 54.

Figure 13:
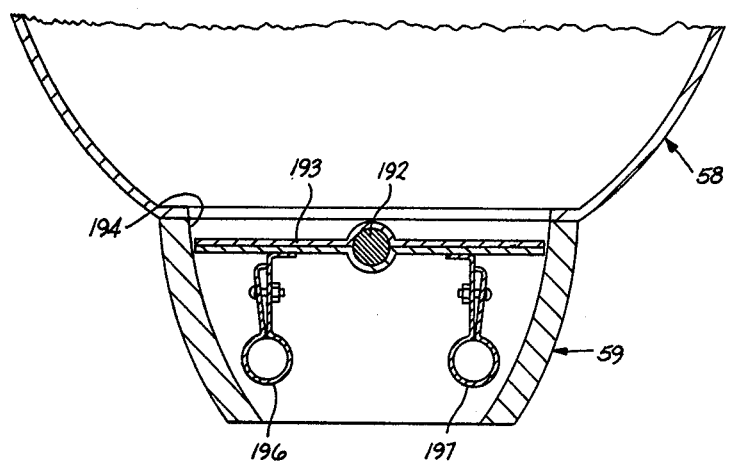
FIG. 13 is a sectional view taken along line 13—13 of FIG. 12 showing details of the ultraviolet lamp facilities of FIG. 12.
Figure 12:
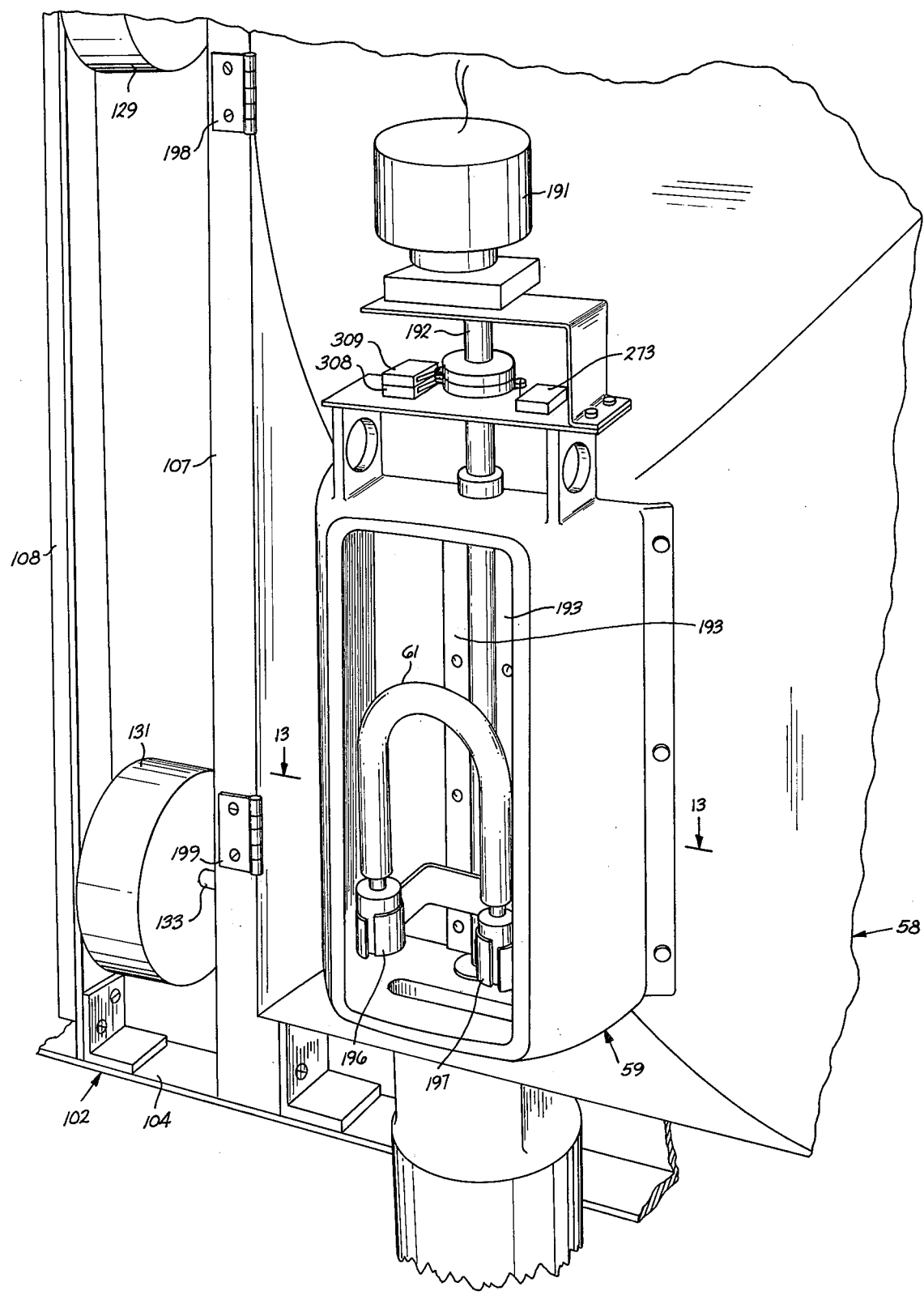
FIG. 12 is a perspective view with parts removed showing facilities, including a support and reflector, for an ultraviolet lamp.

The support frame 53 supports the circuit pattern master 39 (FIG. 2) thereon. A plurality of lamps 56 are supported on the table 52 and are positioned to direct light rays through openings in the table, selected ones of the slots 36, 38a and 38b of the flexible web 31, windows 43, 44a, 44b and 45 of the pattern master 39 and onto light sensing devices 57 which are supported on the frame 53. A reflector, designated generally by the numeral 58, is also located at the first station 54 and is connected to a housing, designated generally by the numeral 59, which supports therein an ultraviolet lamp 61 (FIGS. 12 and 13).

The flexible web 31 is further passed from the first exposure station 54 partially about a vacuum gripping, out-feed drum, designated generally by the numeral 62, and subsequently is positioned in a free loop arrangement between a series of vertically spaced and aligned lamps 63, 64 and 66 which are aligned with corresponding light sensitive devices 67, 68 and 69.

The flexible web 31 is then passed partially about another vacuum gripping, in-feed drum designated generally by the numeral 71. Thereafter, the flexible web 31 is passed into a second exposure station 72. The second exposure station 72 is identical to the first exposure station 54. Therefore, the description of the facilities located at the first exposure station 54 will suffice to also describe the facilities located at the second exposure station 72.

The flexible web 31 is passed from the second exposure station 72 partially about a second vacuum gripping, out-feed drum, designated generally by the numeral 73, and is subsequently taken up by the takeup reel 49.

In the general operation of the exposure treatment of the flexible web 31, the flexible web is drawn into the first exposure station 54 by operation of the vacuum gripping drums 51 and 62. As the slot 36 (FIG. 1) of the flexible web 31 passes adjacent to the window 45 (FIG. 2) of the pattern master 39, one of the light sensitive devices 57, which is a phototransistor, responds to light passing through the slot and window to control the operation of the vacuum gripping drums 51 and 62 to operate the drums at a slower speed. Therefore, the slot 36 of the flexible web 31 and the window 43 (FIG. 2) of the pattern master 39 are aligned generally whereby the vacuum gripping drums 51 and 62 stop. If the slot 36 and the window 43 are not precisely aligned, the corresponding light sensitive device 57 responds to facilitate control of the vacuum gripping drums 51 and 62 to slowly and accurately position the section of flexible web 31 so that the slot and window are in precise alignment. Thereafter, the table 52 is moved into engagement with the positioned section of the flexible web and vacuumly grips the web section.

Simultaneously, the slots 38a and 38b (FIG. 1) of the flexible web 31 are also generally aligned with the windows 44a and 44b (FIG. 2), respectively, of the pattern master 39. The light sensitive devices 57 aligned generally with the slots 38a and 38b and the windows 44a and 44b respond to the general alignment thereof to facilitate positioning control of the support frame 53 and precise aligning of the slots 38a and 38b with the windows 44a and 44b. This results in the accurate positioning of the pattern master 39 with the positioned section of the flexible web 31. The art detail 42 of the pattern master 39 is now positioned so that land areas of the art detail are precisely located adjacent to the prepunched holes 34 formed in positioned section of the flexible web 31.

After the pattern master 39 has been precisely aligned with the positioned section of the flexible web 31, the pattern master and section of the flexible web are moved into intimate contact within an airtight enclosure and exposed to the rays of the ultraviolet lamp 61 (FIGS. 12 and 13) to expose those portions of the film 35 of photoresist material not covered by the art detail 42 of the pattern master 39. Subsequent to the ultraviolet exposure, the indexing of the flexible web 31 continues and the next successive section of the flexible web is moved into the station 54 for a similar positioning and exposure process.

As the flexible web 31 is indexed through the second station 72, a similar positioning and exposure process takes place wherein the uncovered portions of the film 35 of photoresist material on the opposite side of the flexible web is exposed to ultraviolet rays.

LOOP CONTROL

To facilitate control of the flexible web 31 between the two stations 54 and 72, the lamps 63, 64 and 66 sense the presence or absence of an intermediate loop of the flexible web. This insures that the facilities at the two stations 54 and 72 can operate independently of each other and yet follow the operation of the facilities at the other station to maintain a working loop of the flexible web 31 between an upper limit light path provided by the lamp 63 and a lower limit light path provided by the lamp 66. For example, if the loop of the flexible web 31 extends below the light path emanating from the lamp 66, the facilities at the station 54 will not operate until sufficient sections of the flexible web 31 have been indexed through the station 72 to raise the lower end of the loop above the light path emanating from the lamp 64. Thereafter, the facilities at both stations 54 and 72 will operate providing the lower end of the loop of the flexible web 31 stays between the light paths emanating from the lamps 63 and 66.

If the facilities at the station 72 index the sections of the flexible web 31 therethrough at a rate faster than it is being supplied by the facilities at the station 54, the lower end of the loop of the flexible web will be raised above the upper limit light path emanating from the lamp 63. Thereafter the facilities at the station 72 will not operate until sufficient sections of the flexible web 31 have been indexed through the facilities at the station 54 to move the lower end of the loop of the flexible web below the light path emanating from the lamp 64. Thereafter, the facilities at both stations 54 and 72 will operate at will providing that the lower end of the loop of the flexible web 31 stays between the light paths emanating from the lamps 63 and 66.

After the sections of the flexible web 31 have been processed through the second station 72, the sections are taken up onto the reel 49. When the reel 49 has a full supply of the processed flexible web 31 thereon, the reel is transported to another location (not shown) for further processing of the flexible web as previously described.

VACUUM GRIPPING DRUMS

Figure 4:
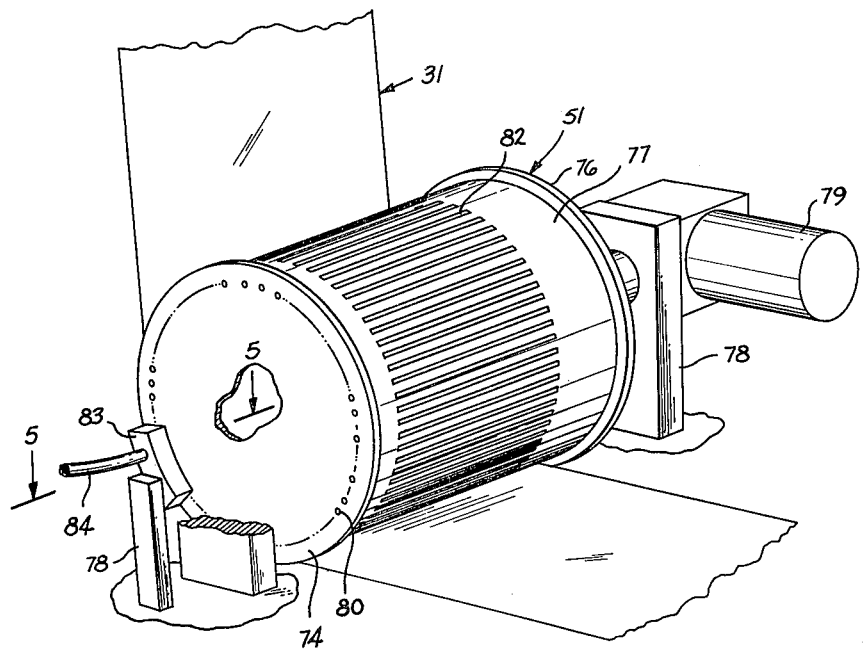
FIG. 4 is a perspective view showing a vacuum gripping drum for moving the flexible web of FIG. 1.
Figure 5:
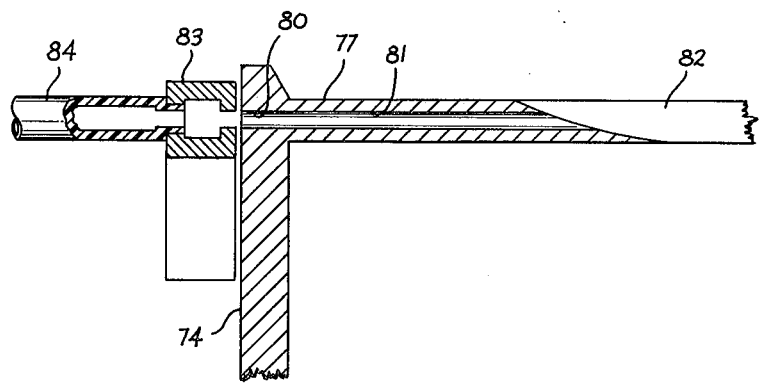
FIG. 5 is a partial sectional view taken along line 5—5 of FIG. 4 showing detail structure of the vacuum gripping drum.

Each of the vacuum gripping drums 51, 62, 71 and 73 is formed of identical structure. For example, as illustrated in FIGS. 4 and 5, the vacuum gripping drum 51 includes a pair of spaced, parallel flanges 74 and 76 with a cylinder 77 interspaced therebetween and assembled integrally therewith. The cylinder 77 is in axial alignment with the flanges 74 and 76, all of which are supported for rotation along the axis on a fixed frame 78 which forms a portion of the housing 46 (FIG. 3). A drive motor 79 rotates the drum 51.

Flange 74, is formed with a series of through holes 80, each of which communicates with a corresponding one of a plurality of enclosed passageways 81 (FIG. 5) formed in the cylinder 77. Each of the enclosed passageways 81 communicates with a corresponding one of a plurality of opened slots formed in the periphery of the cylinder 77. An arcuately shaped vacuum shoe 83 is fixedly positioned adjacent to the path of the holes 80 and is connected to vacuum tubing 84 which is connected to a vacuum source (not shown). Therefore, as the holes 80 pass adjacent to the vacuum shoe 83, air is drawn through the slot 82, the closed passageway 81, the hole 80 and the vacuum shoe 83. As the flexible web 31 is moved about the portion of the drum 51 which contains the slot 82 in communication with the vacuum shoe 83, a vacuum is created in the vicinity of those slots 82 which are covered by the flexible web 31 and which are in communication with the stationary vacuum shoe 83. This process facilitates the vacuum gripping of successive sections of the flexible web 31 being passed partially about the drum 51.

As noted above, each of the remaining vacuum gripping drums 62, 71 and 73 (FIG. 3) are identical in structure and are connected to the vacuum source to permit those sections of the flexible web 31 to also be vacuum gripped. In this manner, the flexible web is processed through the stations 54 and 72 by control of electrical drive facilities, such as the drive motor 79, and the vacuum source associated with the vacuum gripping drums 51, 62, 71 and 73.

PATTERN MASTER SUPPORT

Figure 6:
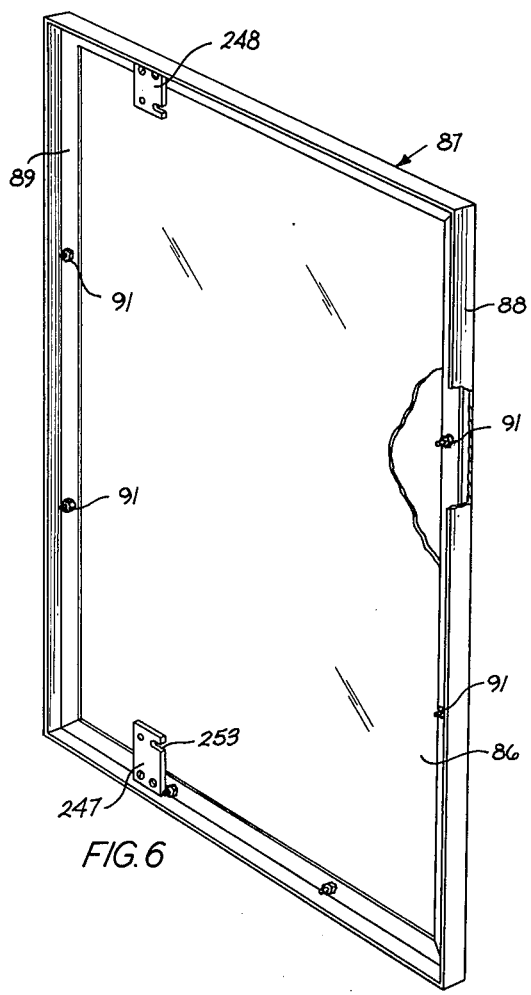
FIG. 6 is a perspective view with parts broken away showing a frame for supporting the printed circuit pattern master of FIG. 2.

The pattern master 39 is adhesively supported on a transparent glass substrate 86 as illustrated in FIG. 6, which is mounted in a frame designated generally by the numeral 87. The frame 87 includes a four-sided outer section 88 into which the substrate 86 is positioned and, further, includes a four-sided inner section 89 which is positionable over the edges of the substrate 86 to capture the edges between the inner section and the outer section. Fasteners 91 are used to secure the substrate 86, the outer section 88 and the inner section 89 in the assembled relation as illustrated in FIG. 6.

Figure 7:
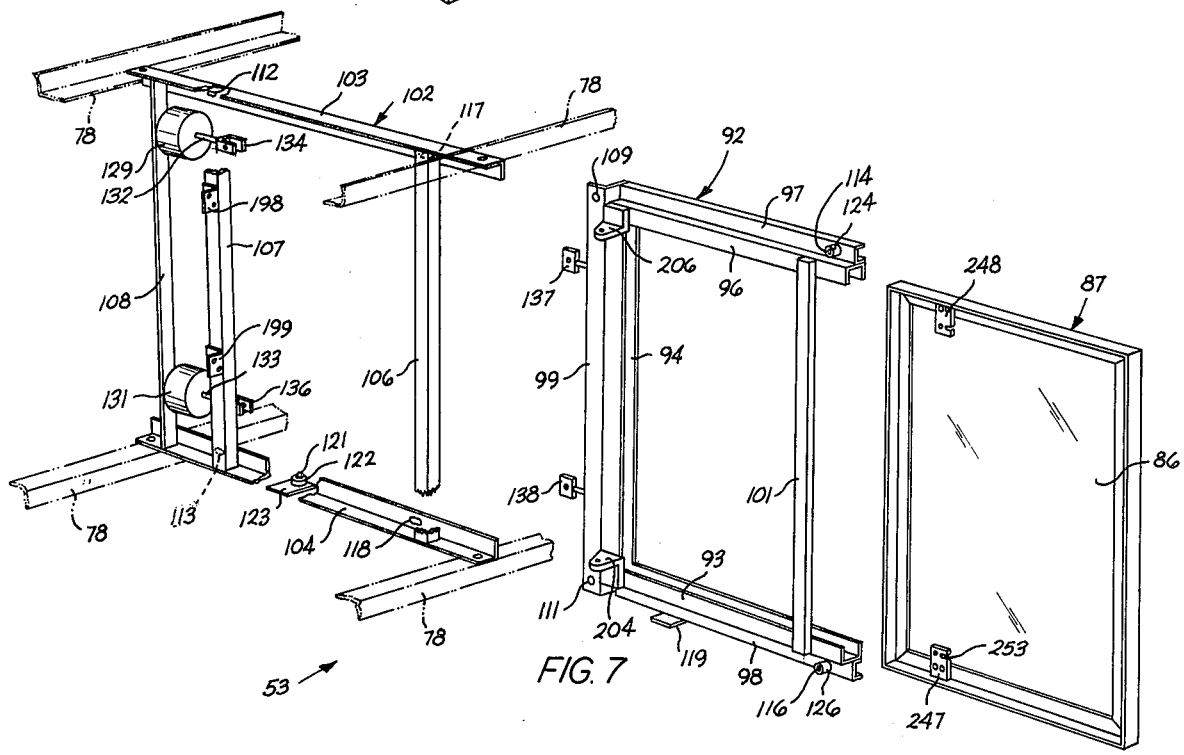
FIG. 7 is an exploded perspective view showing facilities for adjustably supporting the pattern master frame of FIG. 6.

Referring now to FIG. 7, the frame 87 is positionable within a carrier designated generally by the numeral 92. Generally, the carrier 92 includes a bottom horizontal U-shaped channel 93, a vertical U-shaped side channel 94 and a top horizontal U-shaped channel 96 which are arranged in a three-sided "C" configuration for the reception of the frame 87. The carrier 92 is further provided with support channels 97 and 98 at the top and bottom, respectively, thereof and a vertical side support channel 99 adjacent to the vertical U-shaped channel 94. A support strap 101 extends between the channels 93 and 96 to provide support therefor.

A fixed frame 102 includes a top angle bar 103 and a bottom angle bar 104, each secured at opposite ends thereof to the frame 78 of the housing 46 (FIG. 3). The fixed frame 102 further includes a pair of vertical, spaced side angle bars 106 and 107 connected at opposite ends thereof to the top and bottom bars 103 and 104. A third vertical angle bar 108 extends between and is connected to opposite ends thereof to the top and bottom bars 103 and 104.

Figure 14:
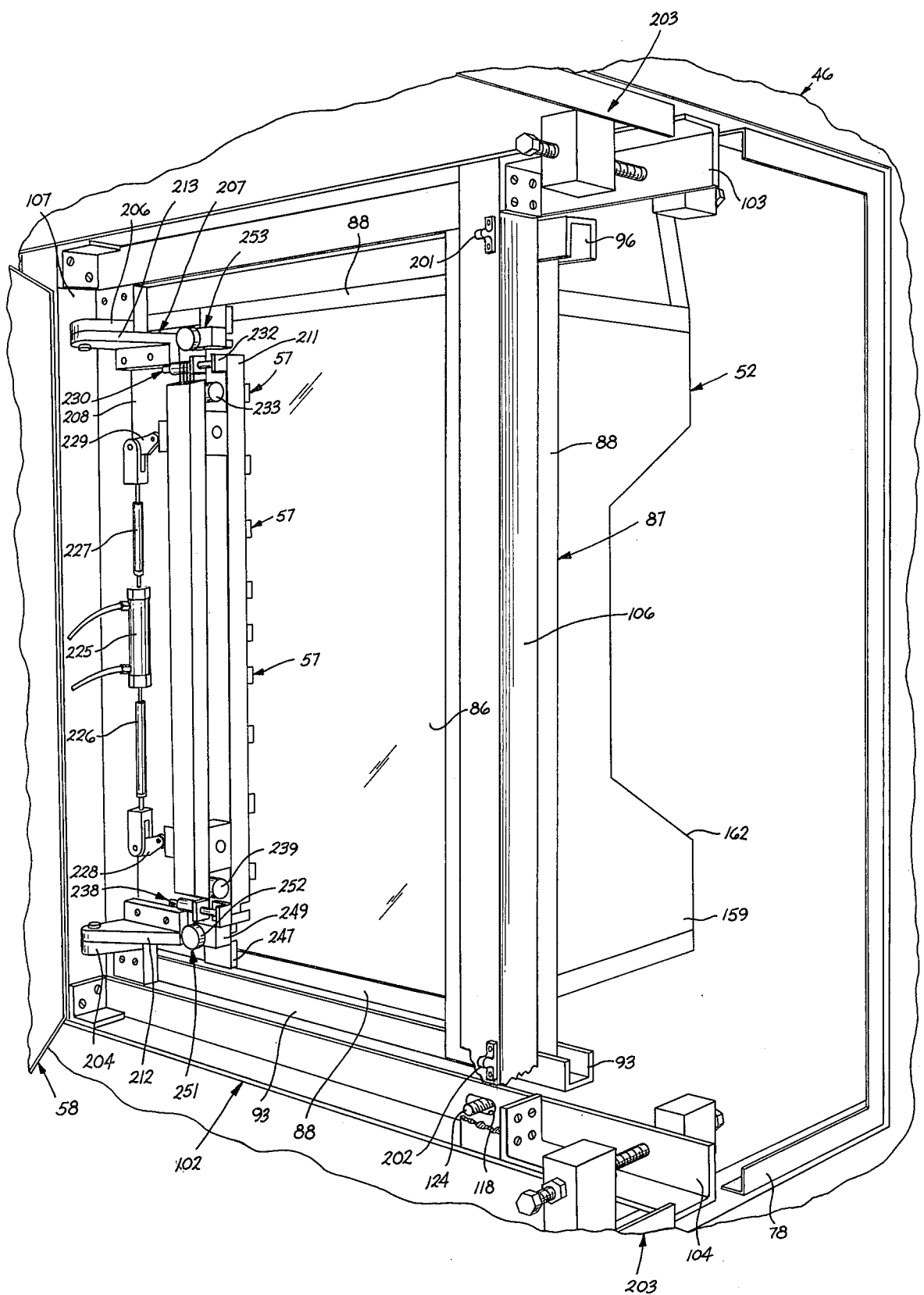
FIGS. 14 and 15 are perspective views of the elements of FIGS. 4 through 13 to form the material processing and exposure apparatus in accordance with certain principles of the invention.
Figure 15:
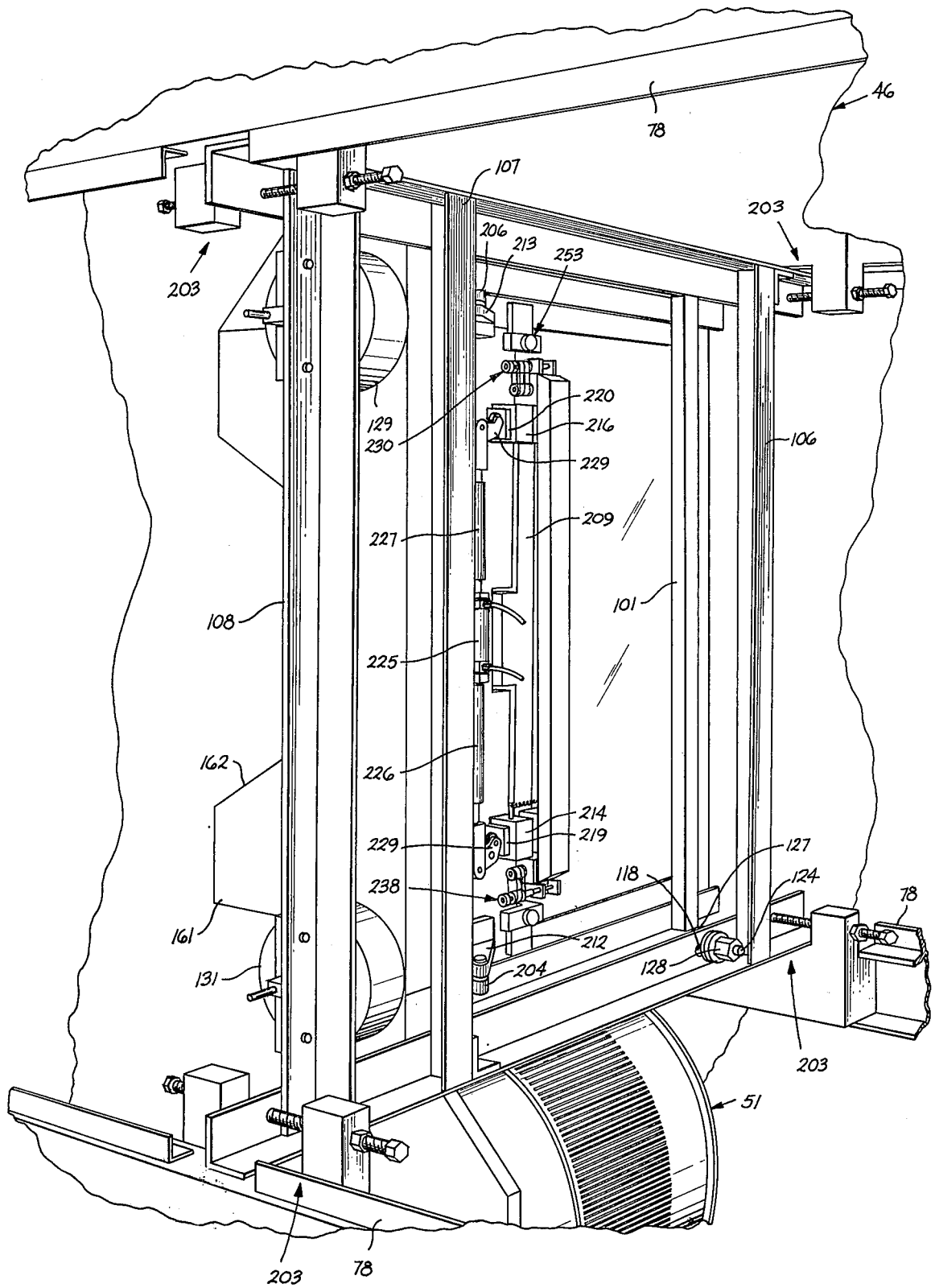

As illustrated in FIGS. 14 and 15, each of the four corners of the fixed frame 102 (FIG. 7) are fastened to the frame 78 of the housing 46. Prior to the final securing of the fixed frame 102 to the housing frame 78, locking bolt assemblies, designated generally by the numeral 105, which are secured to the housing frame, are utilized to accurately locate the fixed frame 102 with respect to the housing frame 78 and to facilitate the locking of the fixed frame in the located position. Thereafter, the fixed frame 102 is secured to the housing frame 78.

The frame 87, carrier 92 and fixed frame 102 combine to provide the support frame 53 (FIG. 3).

Bolt holes 109 and 111 are formed in opposite ends of the side channel 99 and are ultimately alignable adjacent to oversized openings 112 and 113, respectively, formed in the top and bottom bars 103 and 104, respectively, of the fixed frame 102. A pair of bolt holes 114 and 116 are formed in the channels 97 and 98, respectively, of the carrier 92 and are alignable with oversized holes 117 and 118, respectively, formed in the top and bottom, respectively, of the side angle bar 106 of the fixed frame 102.

Figure 8:
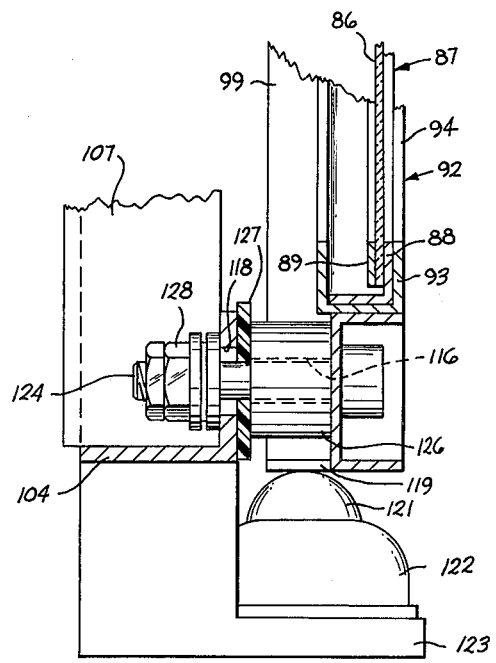
FIG. 8 is a partial sectional view showing portions of the facilities of FIG. 7 for permitting adjusting movement of the pattern master frame of FIG. 6.

Referring to FIG. 8, when the carrier 92 is positioned adjacent to the fixed frame 102, a bearing plate 119 which extends from the underside of the bottom channel 98 of the carrier 92 is positioned on a ball bearing 121 which is supported within a housing 122 mounted on an underside extension 123 of the fixed frame 102.

After the carrier 92 has been positioned adjacent to the fixed frame 102, a bolt 124 is positioned through the opening 116 formed in the underside channel 98 of the carrier, through a spacer 126, a plastic washer 127, the aligned oversized opening 118 formed in the bottom bar 104 of the fixed frame and is secured in this position by a fastening nut 128. Each of the other pairs of aligned holes 111, 113, and 109, 112 and 114, 117 have one of the bolts 124 assembled in the same manner with the spacer 126, plastic washer 127 and fastening nut 128.

Referring to FIG. 7, a pair of positioning motors 129 and 131 are mounted to the top and bottom, respectively, of the third vertical angle bar 108 of the fixed frame 102. Axially moveable rods 132 and 133 extend from the positioning motors 129 and 131, respectively, and support yokes 134 and 136, respectively, at the free ends thereof. A pair of fastening brackets 137 and 138 are attached at upper and lower spaced locations to one side of the side channel 99 of the carrier 92 and are positioned to be inserted into the yokes 134 and 136, respectively, when the carrier is assembled with the fixed frame 102. Fastening elements (not shown) are used to secure the brackets 137 and 138 with the corresponding yokes 134 and 136, respectively.

As illustrated in FIG. 8, the oversized hole 118 is larger then the bolt 124 in all radial directions from the axis of the oversized hole. This permits limited positioning of the carrier 92 with respect to the fixed frame 102 wherein such positioning is accomplished by operation of the positioning motors 129 and 131 to axially move the rods 132 and 133, respectively. Such movement of the rods 132 and 133 moves the carrier 92, and the pattern master-supporting frame 87, in its supported position about the ball bearing 119. In this manner the pattern master 39, which is supported on the transparent substrate 86 is thereby positionable.

VACUUM GRIPPING TABLE

Figure 9:
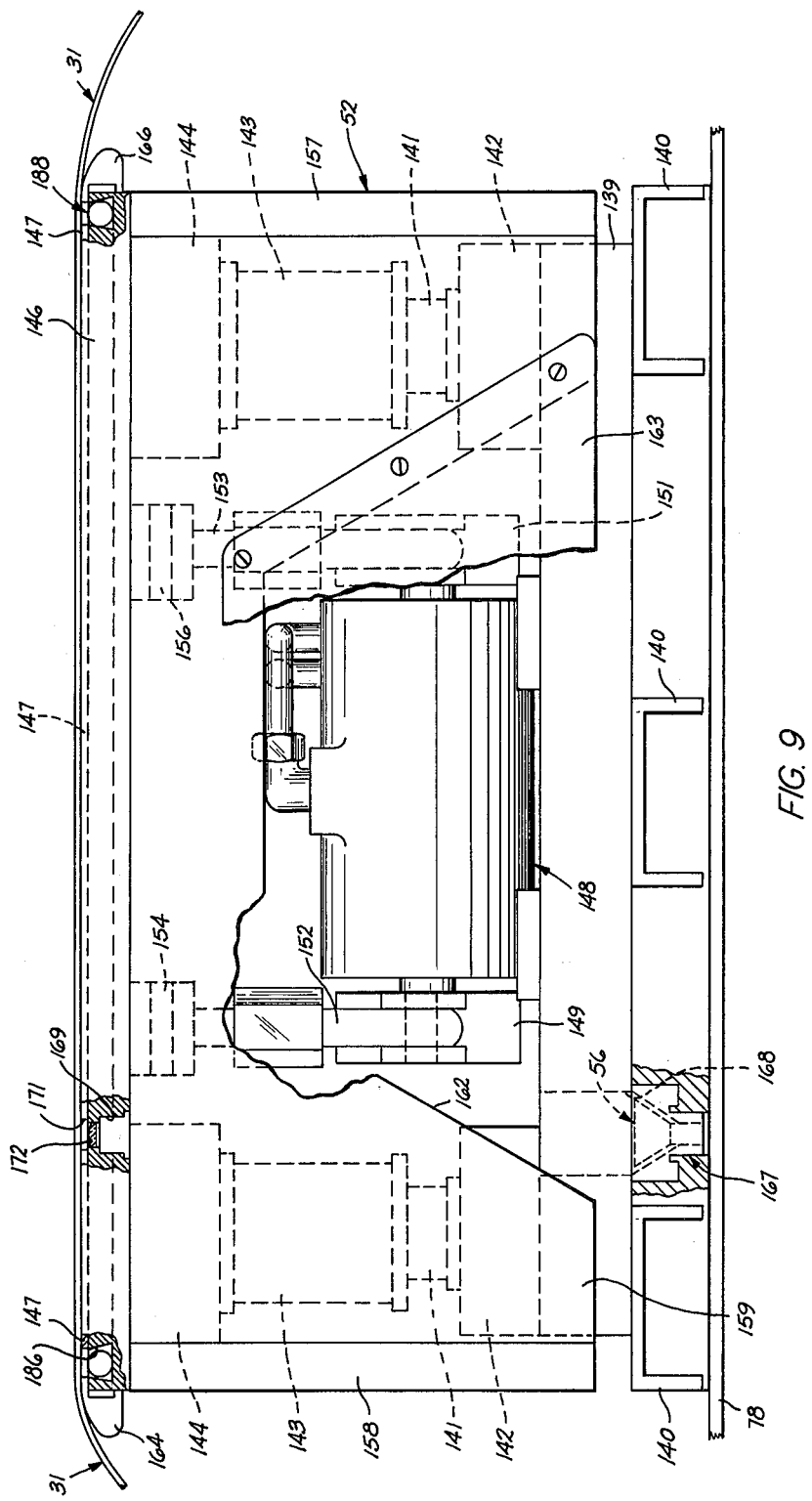
FIG. 9 is a plan view of vacuum gripping table.
Figure 11:
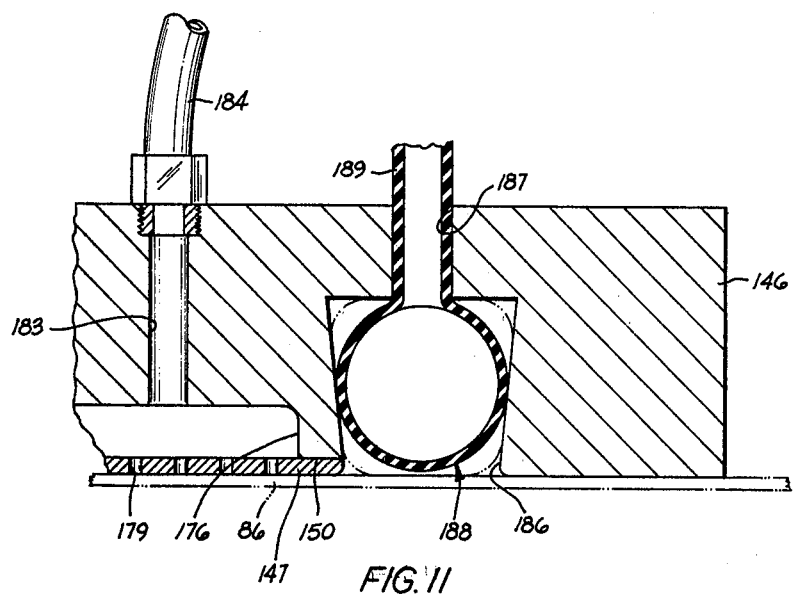
FIG. 11 is a partial sectional view showing details of the vacuum gripping table of FIG. 9.

Referring now to FIG. 9, the vacuum gripping table 52 includes a base plate 139 which is fixedly secured to fixed channels 140 which are secured to the frame 78 of the housing 46. Four corner posts 141 are mounted on pedestals 142 which are attached to the base plate 139. Four bearing cylinders 143 are positioned at their lower ends thereof over corresponding ones of the bearing posts 141 for movement relative thereto. The upper ends of the bearing cylinders 143 are secured to corner support plates 144 which are, in turn, secured to the underside of a table plate 146. An apertured table cover 147 is positioned on a depressed shoulder 150 (FIG. 11) formed in the table plate 146 and is secured thereto. The outer surface of the table cover 147 is in the same plane as the outer surface of the table plate 146 as illustrated in FIG. 11.

A pneumatically driven rotary device, designated generally by the numeral 148, is mounted on the base plate 139 in a central position between the base plate and the table plate 146. A pair of crankshafts 149 and 151 extend from opposite ends of the rotary device 148 and are connected to a pair of crankarms 152 and 153, respectively. The upper ends of the crankarms 152 and 153, respectively, are attached to the underside of the table plate 146 by mounting pads 154 and 156, respectively. A pair of end plates 157 and 158 and a pair of side plates 159 and 161 (FIG. 15) provide an enclosure for the facilities of the vacuum gripping table 52 between the base plate 139 and the table plate 146. The side plates 159 and 161 are formed with a cutout 162 which can be covered by a clear plastic cover 163 as illustrated partially in FIG. 9.

A rounded entry ramp 164 is secured to one end of the table plate 146 to provide smooth entry of the flexible web 31 into a position over the table cover 147. A rounded exit ramp 166 is secured at the opposite end of the table plate 146 to permit smooth exit of the flexible web 31 from the vacuum gripping table 52.

As further illustrated in FIG. 9, a single lamp socket support, designated generally by the numeral 167, is attached to the frame-support side of the base plate 139 and is positioned in alignment with an aperture 168 which extends through the base plate. The lamp socket support 167 is provided with facilities for supporting one of the lamps 56 which is of the spotlight type. The center line of the lamp support 167 and the aperture 168 is coincidental with the center line of a lens-supporting aperture 169 formed in the table plate 146 and an aperture 171 formed in the table cover 147. The light emanating from the lamp 56 will pass through the aligned apertures 168, 169 and 171 and will be collimated by a lens 172 secured in the aperture 169. Eight other lamps 56 are supported in an identical fashion at spaced, aligned locations and extend in a horizontal row with respect to FIG. 9.

Figure 10:
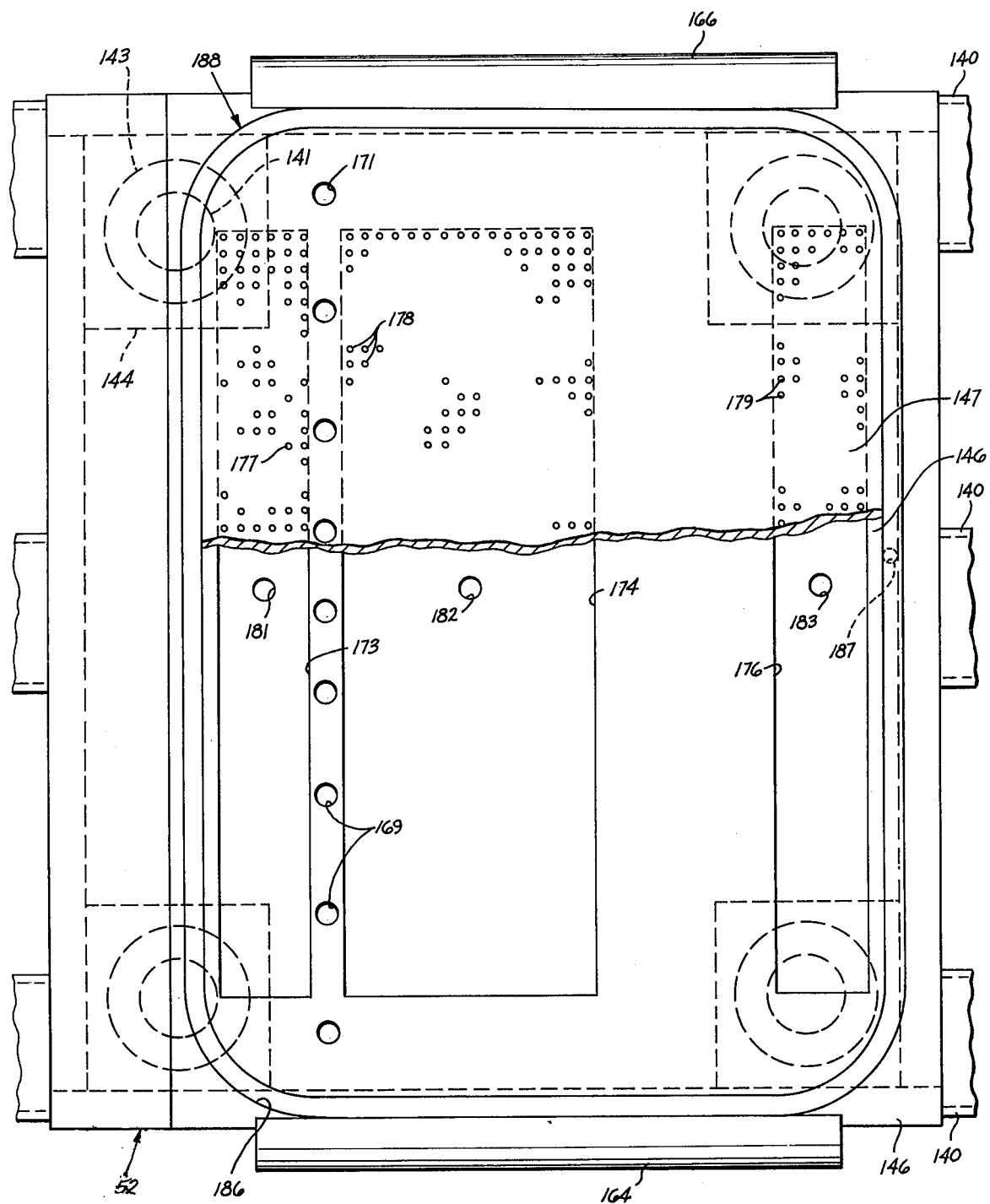
FIG. 10 is a front view of the vacuum gripping table of FIG. 9.

Referring to FIG. 10, the table cover 147 of the vacuum gripping table 52 is broken away to reveal chambers 173, 174 and 176 formed spatially and separately in the face of the table plate 146 adjacent to the table cover. The table cover 147 is formed with three sets of apertures 177, 178 and 179 which communicate with the chambers 173, 174 and 176, respectively, of the table plate 146. As viewed in FIG. 10, the chambers 173, 174 and 176 extend essentially from top to bottom of the table plate 146. The chambers 173, 174 and 176 communicate with passageways 181, 182 and 183, respectively, formed in the base thereof to facilitate application of a vacuum to the apertures 177, 178 and 179. A vacuum line 184 (FIG. 11), for example, is connected to the chamber 176 to facilitate connection to a vacuum source. The remaining chamber passageways 181 and 182 are similarly connected to corresponding vacuum lines.

Referring to FIG. 11, the table plate 146 is formed with an endless dovetail slot 186 which extends around the edge of the table plate as illustrated in FIG. 10. In addition, the peripheral edge of the table cover 147 is flush with the inside side wall of the dovetail slot 186 as illustrated in FIG. 11. A hole 197 is formed in the back side of the table plate 146 and communicates with the base of the slot 186. An endless inflatable tube seal 188 is positionable within dovetail slot as illustrated in FIG. 11 so that the portion of the seal which extends toward the opening of the slot is normally slightly recessed therefrom. The inflatable seal 188 is formed with a stem 189 which extends through the opening 184 in the table plate 146 to provide connection to a pressurized air supply 278 (FIG. 24) for selectively inflating the seal. When the seal 188 is inflated, it extends partially from the dovetail slot 186 to a position illustrated in phantom in FIG. 11.

ULTRAVIOLET LAMP AND REFLECTOR

Referring now to FIG. 12, the housing 59 is secured to the reflector 58 and supports the ultraviolet lamp 61. A shutter drive motor 191 is positioned on top of the housing 59 and is connected to and drives a rotatable shaft 192. Referring to FIGS. 12 and 13, the portion of the rotatable shaft 192 which is located within the housing 59, is secured to a shutter door 193 which, as illustrated in FIG. 13, extends across and covers an opening 194 of the housing 59 where the housing is secured to the reflector 58. A pair of clamps 196 and 197 are secured to the shutter door 193 in a spaced relation and receive opposite ends of the U-shaped ultraviolet lamp 61 as specifically illustrated in FIG. 12. Upon electrical command, the shutter drive motor 191 rotates the shaft 192 which, in turn, rotates the shutter door 193 about the axis of the shaft to position the continuously operating ultraviolet lamp 61 into the opening 194. The ultraviolet rays emanating from the lamp 61 are then directed into the area enclosed by the inner walls of the reflector 58 and onto the preassembled pattern master 39 and adjacent section of the flexible web 31. After a prescribed time, the motor 191 is controlled to reverse rotate the shaft 192 whereby the shutter door 193 and the ultraviolet lamp 61 are returned to the position as illustrated in FIGS. 12 and 13.

Referring further to FIG. 12, the reflector 58 is attached to a pair of hinges 198 and 199 along one vertical edge thereof. The hinges 198 and 199 are attached to the side angle bar 107 (FIG. 7) which forms a portion of the fixed frame 102. Referring to FIG. 14, a pair of spring-biased fasteners 201 and 202 are secured to the side angle bar 106 of the fixed frame 102 (FIG. 7) and provide securing facilities for the reflector 58 which, as illustrated in FIG. 14, is in the open position but retained with the fixed frame 102 by virtue of the hinges 198 and 199 (FIG. 12).

SUPPORT FOR LIGHT SENSITIVE DEVICES

Referring to FIGS. 7 and 14, a pair of mounting brackets 204 and 206 are attached to the bottom and top, respectively, of the vertical U-shaped side channel 94 and the vertical side support channel 99 of the carrier 92.

Figure 16:
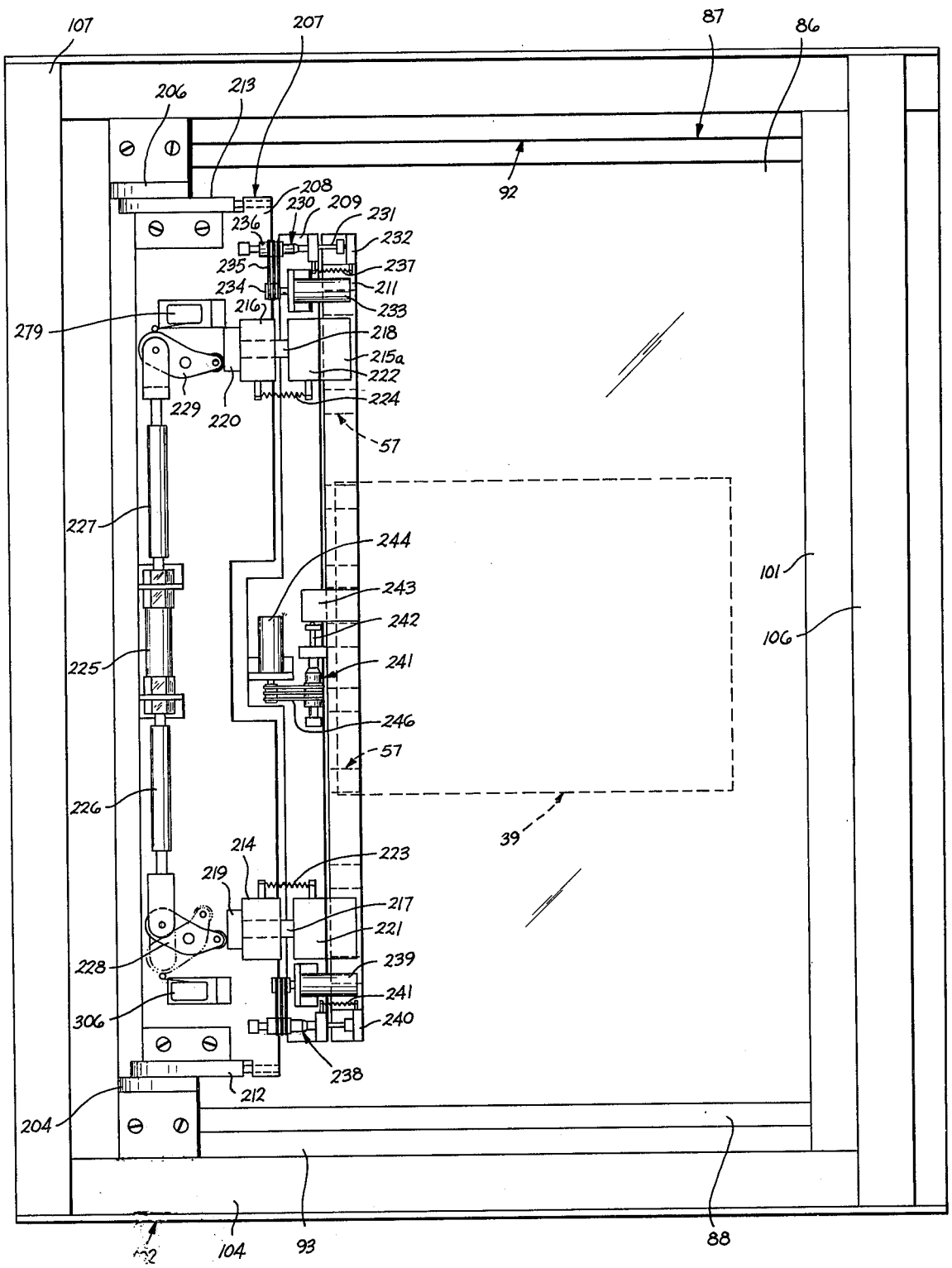
FIG. 16 is a front view of an adjustable support for light sensitive devices in accordance with certain principles of the invention.

Referring to FIGS. 14 and 16, there is illustrated a sensor support mechanism designated generally by the reference numeral 207. As clearly illustrated in FIG. 16, the sensor support mechanism 207 includes three support plates 208, 209 and 211. A pair of mounting brackets 212 and 213 are mounted at the bottom and top, respectively, of the support plate 208. The mounting brackets 212 and 213 are positioned adjacent to the mounting brackets 204 and 206 and are secured thereto for pivotal movement relative thereto. A pair of bearing blocks 214 and 216 are mounted on the support plate 208 in spaced relation and support for sliding movement a pair of rods 217 and 218, respectively. The rods 217 and 218 are provided with heads 219 and 220, respectively, at one end thereof and are secured to mounting blocks 221 and 222, respectively, at the opposite ends thereof. The mounting blocks 221 and 222 are secured to the support plate 209 in spaced relation and in alignment with the bearing blocks 214 and 216. A first tension spring 223 is connected at opposite ends thereof to the bearing block 214 and the mounting block 221 and normally urges the two blocks toward each other. A second tension spring 224 is similarly connected at opposite ends thereof to bearing block 216 and the mounting block 222 to normally urge the blocks toward each other.

Figure 18:
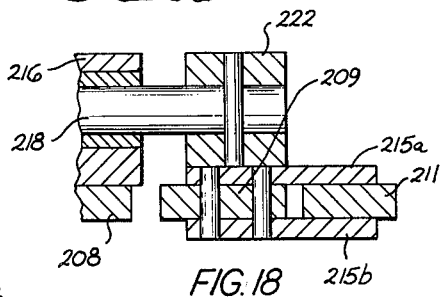
FIG. 18 is a sectional view taken along line 18—18 of FIG. 17 showing additional features of the support of FIG. 16.

As illustrated in FIG. 18, left side portions of a pair of retainer plates 215a and 215b are mounted on and secured to the top and bottom, respectively, of the support plate 209. Right side portions of the retainer plates 215a and 215b extend in cantilever from the support plate 209 and overlap portions of, but are not secured to, the support bar 211. The overlapping portions of the retainer plates 215a and 215b permit relative movement with the support plate 211 but serve to retain the support plate 211 in alignment with the support plate 209. A similar two-plate arrangement is located at the lower ends of the support plate 209 and 211 (FIG. 16) and cooperates with the plates 215a and 215b to retain the plates in alignment.

An air cylinder 225 is mounted on the support plate 208 and controls axial movement of a pair of linkage rods 226 and 227 which extend from opposite axial ends of the air cylinder. The linkage rod 226 is connected to one end of a bell crank cam 228 which is mounted for pivotal movement to the support plate 208 and is always in engagement with the head 219 of the rod 217. The linkage rod 227 is connected to a bell crank cam 229 which is also mounted to the support plate 208 for pivotal movement and is always in engagement with the head 220 of the rod 218. When the air cylinder 225 is operated to move the bell crank cams 228 and 229 to the position as illustrated in FIG. 16, the rods 217 and 218 are thereby moved through the bearing blocks 214 and 216, respectively. Under such movement, the mounting blocks 221 and 222 are moved to the right against the biasing action of the springs 223 and 224, respectively, whereby the support plate 209 is moved to the right.

Figure 17:
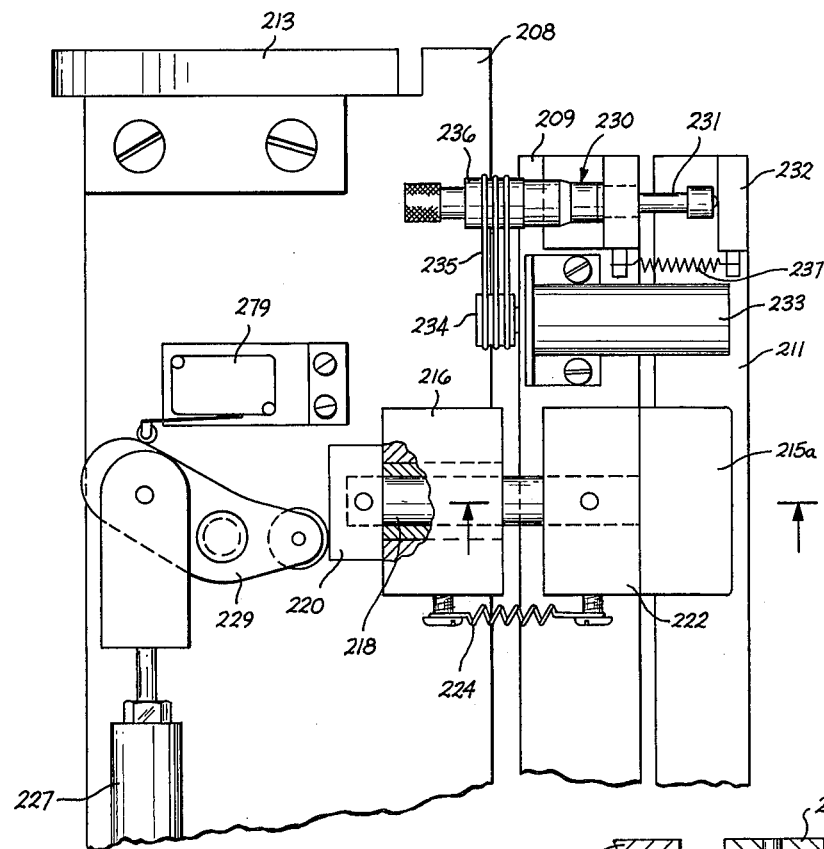
FIG. 17 is a partial enlarged view of portions of the support of FIG. 16 in accordance with certain principles of the invention.

Referring now to FIGS. 16 and 17, a micrometer, designated generally by the numeral 230, is fixedly secured to the support plate 209 at the upper end thereof with an axially moveable probe 231 thereof extending into engagement with a stop block 232 mounted on the upper end of the support plate 211. An adjusting motor 233 is mounted on the upper end of the support plate 209 and is controllable to rotate a sheave 234. A plurality of drive belts 235 extend about the sheave 234 and about a rotatable adjusting member 236 of the micrometer 230. A tension spring 237 is connected at opposite ends thereof to the micrometer mounting on the support plate 209 and the stop block 232 on the support plate 211 and normally urges the two support plates toward each other. Thus the motor 233 can be controlled to rotate the adjusting member 236 of the micrometer 230 to axially move the probe 231 and, in cooperation with the tension spring 237, facilitate the lateral positioning of the upper end of the support plate 211 with respect to the support plate 209.

Referring to FIG. 16, a micrometer, designated generally by the numeral 238, and an electric motor 239, are mounted on the lower end of the support plate 209. In addition, a stop block 240 is mounted on the support plate 211 and a tension spring 241 is attached at opposite ends thereof to the support plates 209 and 211. Under control of the electric motor 239, the micrometer 238 is adjusted to facilitate the lateral positioning of the bottom portion of the support plate 211 with respect to the support plate 209 wherein the tension spring 241 normally urges the two plates toward each other. Thus, the operation and setting of the two micrometers 230 and 238, facilitate the lateral locating of the top and bottom, respectively, of the support plate 211 with respect to the support plate 209.

As further illustrated in FIG. 16, a third micrometer, designated generally by the reference numeral 241, is mounted on the support plate 209 with an axially moveable probe 242 extending upwardly therefrom. The end of the probe 242 engages a stop block 243 which is secured to the support plate 211 and has portions which extend over the adjacent edge of the support plate 209 whereat the probe engages the stop block. An electric drive motor 244 is also mounted on the support plate 209 and is coupled to the micrometer 241 by belts 246. The electric motor 244 is controlled to adjustably rotate the rotatable member of the micrometer 241 to axially move the probe 242. As the probe 242 is moved, it permits the stop block 243 and, consequently, the support plate 211, to follow the vertical movement of the probe. In this manner, the support plate 211 can be vertically positioned within the range of movement of the probe 242.

As more clearly illustrated in FIG. 14, the light sensitive devices 57 are attached to the opposite side of the support plate 211.

As illustrated in FIG. 16, the support plate 211 is positionable adjacent to the left margin of the circuit pattern master 39 so that the light sensitive devices 57, which are supported on the support plate, are alignable with the windows 43, 44a, 44b and 45 of the circuit pattern master. As will be described hereinafter, the air cylinder 225 controls the horizontal movement of the support plates 209 and 211 to selectively position the light sensitive devices 57 adjacent to the windows 43, 44a, 44b and 45 of the pattern master 39 and to retract the support plates after the circuit pattern master has been accurately aligned and positioned with the section of the flexible web 31. As described above, the micrometers 230, 238 and 241 are controllable to position the support plate 211 during a procedure as further described hereinafter when the light sensitive devices 57 on the support plate are accurately aligned with the windows 43, 44a, 44b and 45 of the circuit pattern master 39.

Referring again to FIG. 6, a pair of clamping blocks 247 and 248 are secured to the bottom and top rails of the inner section of the frame 87. When the frame is assembled within the carrier 92, which, is in turn, assembled with the fixed frame 102 as viewed in FIGS. 7 and 16, the clamping blocks 247 and 248 are positioned at the bottom and top, respectively, of the assembly adjacent to the bottom and top of the support plate 211, but spaced therefrom. A fastener support block 249 supports a threaded fastener, designated generally by the reference numeral 251, for free rotational movement therein. The threaded fastener 251 is formed with an enlarged head 252 at one end thereof and with threads at the opposite end thereof which are threadedly insertable into a slotted opening 253 formed in the clamping block 247. The fastener support block 249 is positioned to engage the lower right corner of the support plate 208, as viewed in FIG. 16, so that the corner of the support plate is captured between the fastener support block and the clamping block 247. As the threaded end of the fastener 251 is inserted into the slot 253 of the clamping block 247, the head 252 of the fastener is rotated to secure the fastener support block 249 in assembled clamping relation with the lower right corner of the support plate 207. In addition, this clamping facility also clamps the frame 87 within the bottom channel 93 of the carrier 92.

A similar clamping facility 253 is located at the upper end of the support plate 207 to clamp the upper right end of the support plate as viewed in FIG. 16. In addition, the clamping facility 253 is threadedly attached to the clamping block 248 to facilitate the clamping action in a manner identical to that described with respect to the threaded fastener 251 and the clamping block 247.

Figure 19:
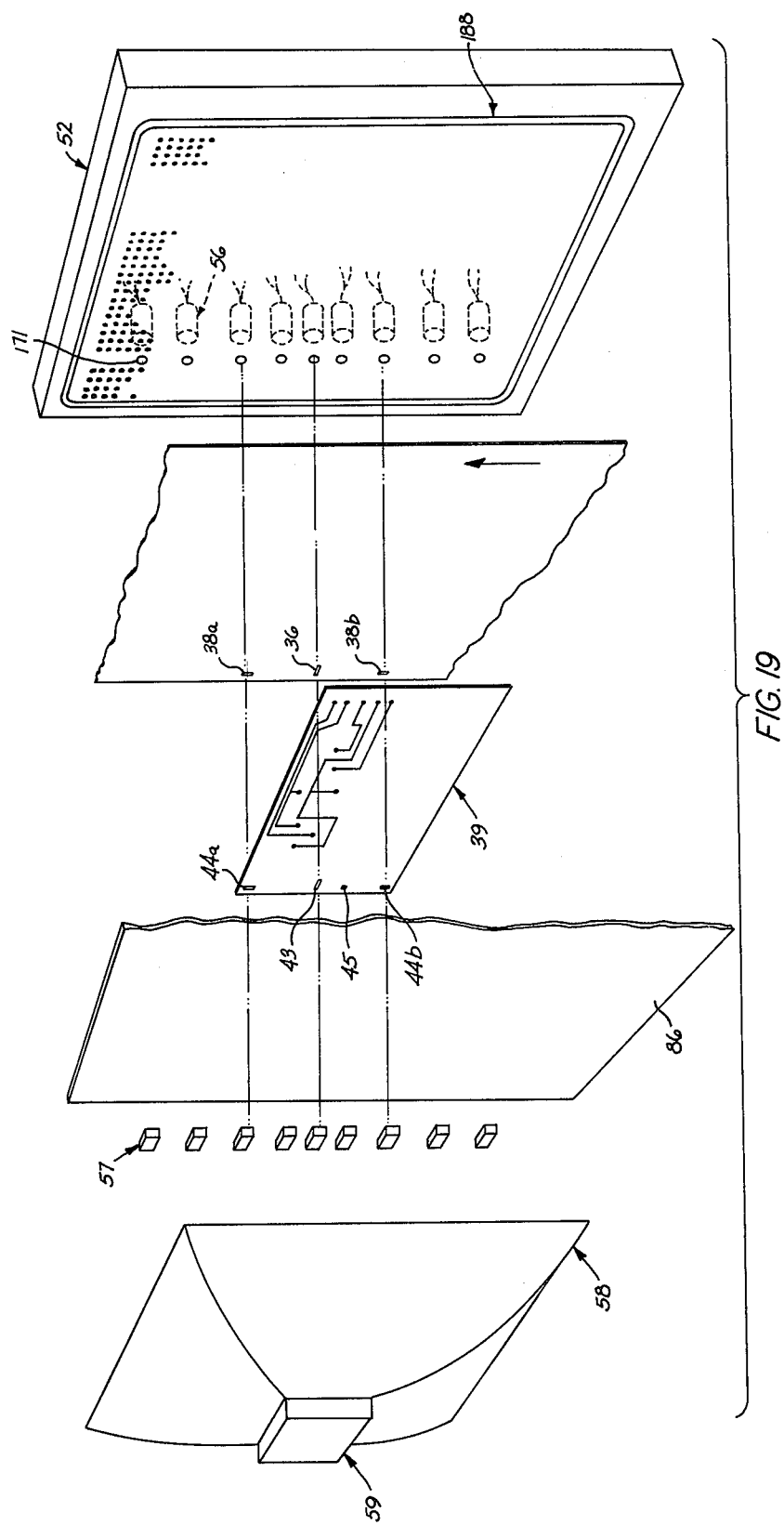
FIG. 19 is an exploded perspective view of certain elements of the material processing and exposure apparatus of FIGS. 14 and 15 illustrated in a desired orientation and alignment with respect to the flexible web of FIG. 1 and the pattern master of FIG. 2.

Referring now to FIG. 19, there is illustrated an exploded view of certain elements of the facilities to show the orientation and alignment of such facilities. The vacuum table 52 is positioned at the right with the lamps 56 located on the back side thereof. The inflatable seal 188 is positioned in the groove 186 of the front face of the table 52. The flexible web 31 is located to the left of the vacuum gripping table 52. The circuit pattern master 39 is located to the left of the flexible web 31 and is secured to the right face of the transparent glass substrate 86. The light sensitive devices 57 are located to the left of the transparent glass substrate 86 and to the right of the reflector 58 which supports the ultraviolet lamp housing 59. Thus, FIG. 19 provides an illustration of the orientation and arrangement of the various elements used in the apparatus 47.

ASSEMBLY AND ADJUSTMENT

In assembly of the apparatus 47 in preparation for the exposure of the flexible web 31 and the pattern master 39 to the ultraviolet lamp 61, the pattern master is positioned on and attached to the surface of the transparent glass substrate 86 (FIGS. 6 and 7) which will interface with the flexible web 31. The art detail 42 is in the upper portion of the positioned pattern master 39. The bottom portion of the pattern master 39 is completely blackened (FIG. 2) except for the slots 44b and 45. A reflective material, such as aluminum foil, is then attached to the substrate 86 to cover those portions thereof not occupied by the pattern master 39. The reflective material prevents the ultraviolet rays from passing through portions of the substrate 86 surrounding the margins of the pattern master 39 and provides a heat reflective surface so that any heat directed toward the flexible web 31 and the pattern master by the ultraviolet lamp 61 is thereby reflected.

Thereafter the frame 87 which supports the assembly of the pattern master 39 on the substrate 86 is inserted into the U-shaped channels 93, 94 and 96 of the carrier 92. The carrier 92 is then assembled with the fixed frame 102 and the yokes 134 and 136 of the motors 129 and 131, respectively, are connected to the fastening brackets 137 and 138, respectively, of the carrier.

After the carrier 92 has been assembled with the fixed frame 102, the air cylinder 225 is controlled to facilitate movement to the right of the support plate 211, as viewed in FIG. 16. As the support plate 211 is moved to the right, the windows 43, 44a and 44b are all aligned generally with corresponding ones of the light sensitive devices 57, which are two-segment photo diodes, and also generally in alignment with corresponding lamps 56. In addition, the window 45 of the pattern master 39, is located in general alignment with a corresponding one of the light sensitive devices 57, which is a phototransistor, and a corresponding one of the lamps 56.

Figure 20:
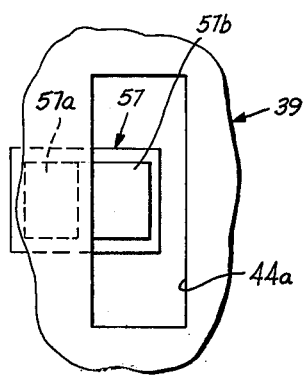
FIG. 20 is a partial plan view of a window in the pattern master of FIG. 2 in general alignment with a light sensitive device.
Figure 21:
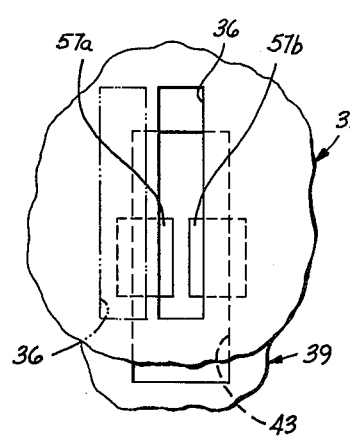
FIGS. 21 and 22 are plan views showing general alignment of a slot in the flexible web of FIG. 1, a window in the pattern master of FIG. 2 and a light sensitive device.
Figure 22:
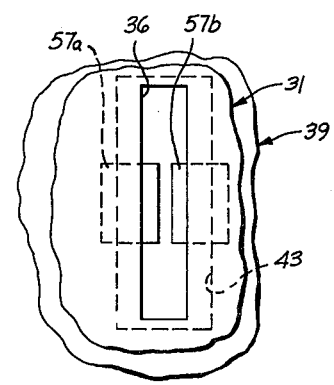

As represented in the illustrations of FIGS. 20, 21 and 22, those light sensitive devices 57 which are photo diodes have two spaced light sensitive segments 57a and 57b. Each of the segments 57a and 57b develop voltage potentials which are proportional to the amount of surface area upon which light rays fall. For example, if light rays were directed upon the entire surface of the segment 57b, a given level of voltage would be developed in response thereto. If light rays fall only upon one-half of the light sensitive surface of the segment 57b, then the level of voltage developed in response thereto, would be one-half of that developed when light fell upon the entire surface.

The light sensitive device 57 which is a phototransistor (not shown), and which is aligned with pattern-master window 45, responds to light rays falling upon any portion of its light sensitive surface to develop a voltage of consistent level.

Figure 23:
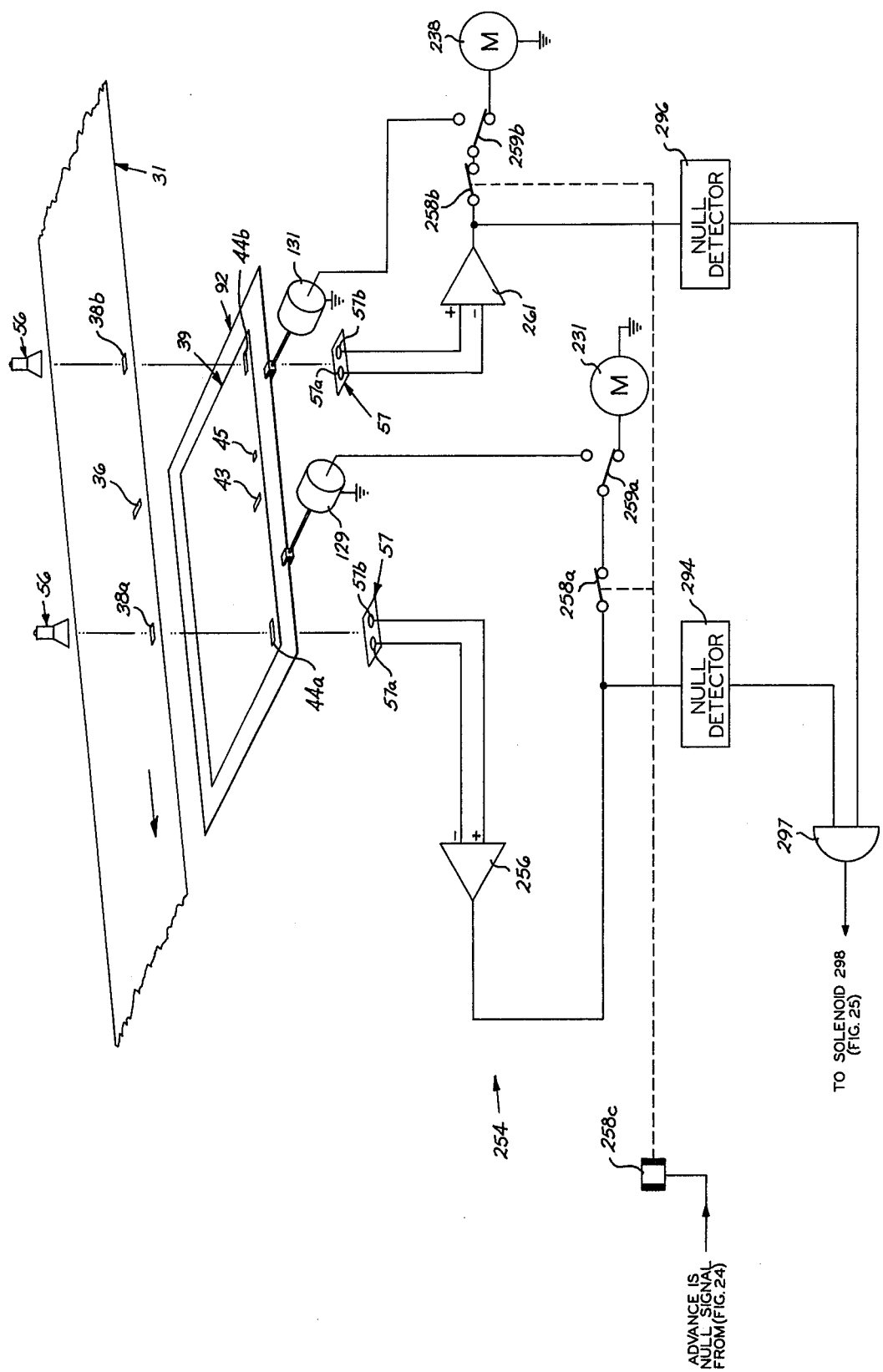
FIG. 23 is an electrical schematic showing facilities for adjusting portions of the support of FIGS. 16 and 17 and for adjusting the frame of FIG. 6.

Referring now to FIG. 23, there is illustrated a schematic of an electrical circuit, designated generally by the numeral 254, which normally controls operation of the positioning motors 129 and 131. Also illustrated schematically in FIG. 23 is a representation of the carrier 92, the pattern master 39, the flexible web 31 and two lamps 56. In preparation for alignment of the windows 43, 44a, 44b and 45 of the pattern master 39 with corresponding light sensitive devices 57 on the support bar 211, armatures 258a and 258b of a "no advance" switch 258 are closed and armatures 259a, 259b and 259c (FIG. 24) of an "adjust-run" switch 259 are manually set to the "adjust" position.

The "no advance" switch 258 is controlled by operational condition of the vacuum drum 62 as described hereinafter. For example, if the vacuum drum 62 is not rotating, the "no advance" switch 258 is closed in response thereto and represents that the flexible web 31 is not being advanced through the apparatus 47. Further, the "adjust-run" switch 259 is manually controlled to facilitate, at selected times, the adjusting of the position of the light sensitive devices 57 with respect to the pattern master 39 and to facilitate, at other selected times, control of the positioning motors 129 and 131 as well as operation of the vacuum drum 62.

Pressurized air from the supply 278 (FIG. 25) is applied through a valve 277 (FIG. 25) to the air cylinder 225 which is thereby operated to move the support plates 209 and 211 to the right (FIG. 16). When the carrier 92 is assembled with the fixed frame 102, the window 44a of the pattern master 39 is positioned adjacent to a corresponding one of the light sensitive devices 57 and would be aligned, for example, as illustrated in FIG. 20. In such an alignment, more light will fall upon the segment 57b than upon the segment 57a whereby different voltage levels are applied to a differential amplifier 256 which develops a signal in response thereto. The developed signal is coupled through one armature 258a of the "no advance" switch 258 and one armature 259a of the "adjust-run" selector switch 259 to the adjusting motor 233 (FIGS. 16 and 17). The adjusting motor 233 is thereby actuated to adjust the micrometer 230 and axially move the probe 231 whereby the upper end of the support plate 211 is moved accordingly.

As the upper end of the support plate 211 is moved to the right as illustrated in FIG. 20, light rays fall upon increasing surface portions of the segment 57a and upon decreasing surface portions of the segment 57b. The adjusting motor 233 continues to control adjusting movement of the probe 231 of the micrometer 230 until the segments 57a and 57b of the light sensitive devices 57 are positioned as illustrated in FIG. 21 with respect to window 44a whereby equal amounts of light fall upon both segments. Since the developed voltages are now equal, there will be no output from the differential amplifier 256 and the motor 233 stops. Due to inherent characteristics of the motor 233, the adjusted positioning of the upper end of the support plate 211 will be maintained throughout the processing of the flexible web 31 through the apparatus 47.

At the time of assembly of the carrier 92 with the fixed frame 102, the window 44b of the pattern master 39 is aligned generally with a corresponding one of the light sensitive devices 57 in a manner similar to the alignment of window 44a and the corresponding light sensitive device 57 as illustrated in FIG. 20. This light sensitive device 57 is also a two-segment photo diode having light sensitive segments 57a and 57b. If the light rays passing from the lamp 56 through the window 44b are not falling equally upon the segments 57a and 57b, different voltage levels are applied to a differential amplifier 261 which develops a signal. The developed signal is coupled through another armature 258b of the "no advance" switch 258, another armature 259b of the "adjust-run" switch 259 to the adjusting motor 239. The adjusting motor 239 is thereby controlled to adjust the micrometer 238 to permit movement of the lower end of the support plate 211 and thereby position the light sensitive devices 57 so that equal amounts of light passing through the window 44b fall upon the segments 57a and 57b. The motor 239 stops and retains the lower end of the support bar 211 in the adjusted position.

Figure 24:
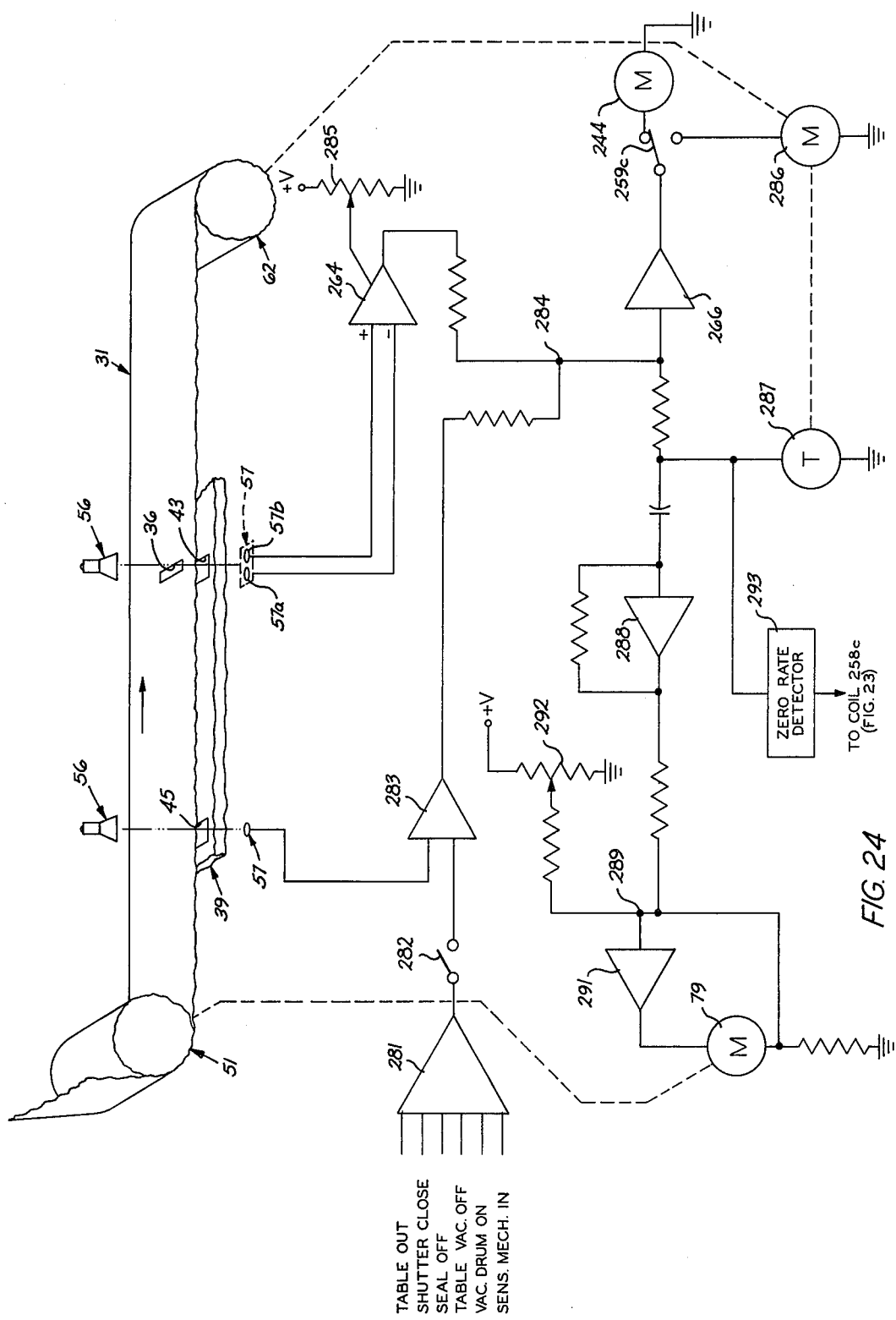
FIG. 24 is an electrical schematic showing facilities for further controlling the adjusting of the support of FIGS. 16 and 17 and also controlling the operation of the vacuum gripping drum of FIG. 4.

Referring now to FIG. 24, there is illustrated an electrical schematic which normally contols the operation of the vacuum drums 51 and 62. When the carrier 92 is positioned within the fixed frame 102, the window 43 of the pattern master 39 is positioned adjacent to a corresponding one of the light sensitive devices 57 in a manner similar to the alignment of window 44a and the corresponding light sensitive device 57 as illustrated in FIG. 20. The light sensitive device 57 is a two-segment photo diode having segments 57a and 57b as illustrated in FIGS. 20 and 21. Again, the segments 57a and 57b respond to the light falling upon the segments and develop different voltages if the surface area of each, upon which the light rays fall, is not equal. These different voltages are applied to a differential amplifier 264 which develops a signal which is fed to a power amplifier 266. The output of the power amplifier 266 is then coupled through a third armature 259c of the "adjust-run" switch 259 to the adjusting motor 244 to operate the motor. As the motor 244 is operated, the micrometer 241 is adjusted to axially move the probe 242 to thereby permit corresponding vertical movement of the support plate 211. Ultimately, the support plate 211 is moved until light rays fall upon equal surface portions of the two segments 57a and 57b of the light sensitive device 57 and the motor 244 stops to thereby accurately position the window 43 with respect to the corresponding light sensitive device 57, as illustrated in FIG. 21, and retain the support bar 211 in the vertically adjusted position.

As the support plate 211 is adjustably positioned so that the windows 43, 44a and 44b of the pattern master 39 are precisely aligned with the corresponding light sensitive devices 57, for example, as illustrated in FIG. 21 with respect to window 43 and its corresponding light sensitive device, the window 45 (FIG. 24) of the pattern master is accurately positioned with respect to a corresponding one of the light sensitive devices which is the phototransistor. The phototransistor light sensitive device 57 is a single segment device which responds to any light of a prescribed magnitude passing through the adjacent window 45 of the pattern master 39. However, as noted above, the path of light through the window 45 is normally blocked by the presence of the flexible web 31.

Thus, the support plate 211 has been accurately positioned in the horizontal direction by the motors 233 and 239, and in the vertical direction by the motor 244, and is retained in the adjusted position. This insures that the windows 43, 44a, 44b and 45 of the pattern master 39 are in accurate alignment with their corresponding light sensitive devices 57 which are mounted on the support plate 211.

After the support plate 211 has been adjusted to accurately align the light sensitive devices 57 with the pattern master 39 so that the windows 43, 44a, 44b and 45 are aligned with corresponding ones of the light sensitive devices 57, the "adjust-run" switch 259 is manually set to move the armatures 259a, 259b and 259c to the "run" position. Thereafter a leading portion of the flexible web 31 is drawn from the supply reel 48 (FIG. 3) and is "threaded" through the apparatus 47 and onto the takeup reel 49 as illustrated in FIG. 3.

OPERATION

Figure 25:
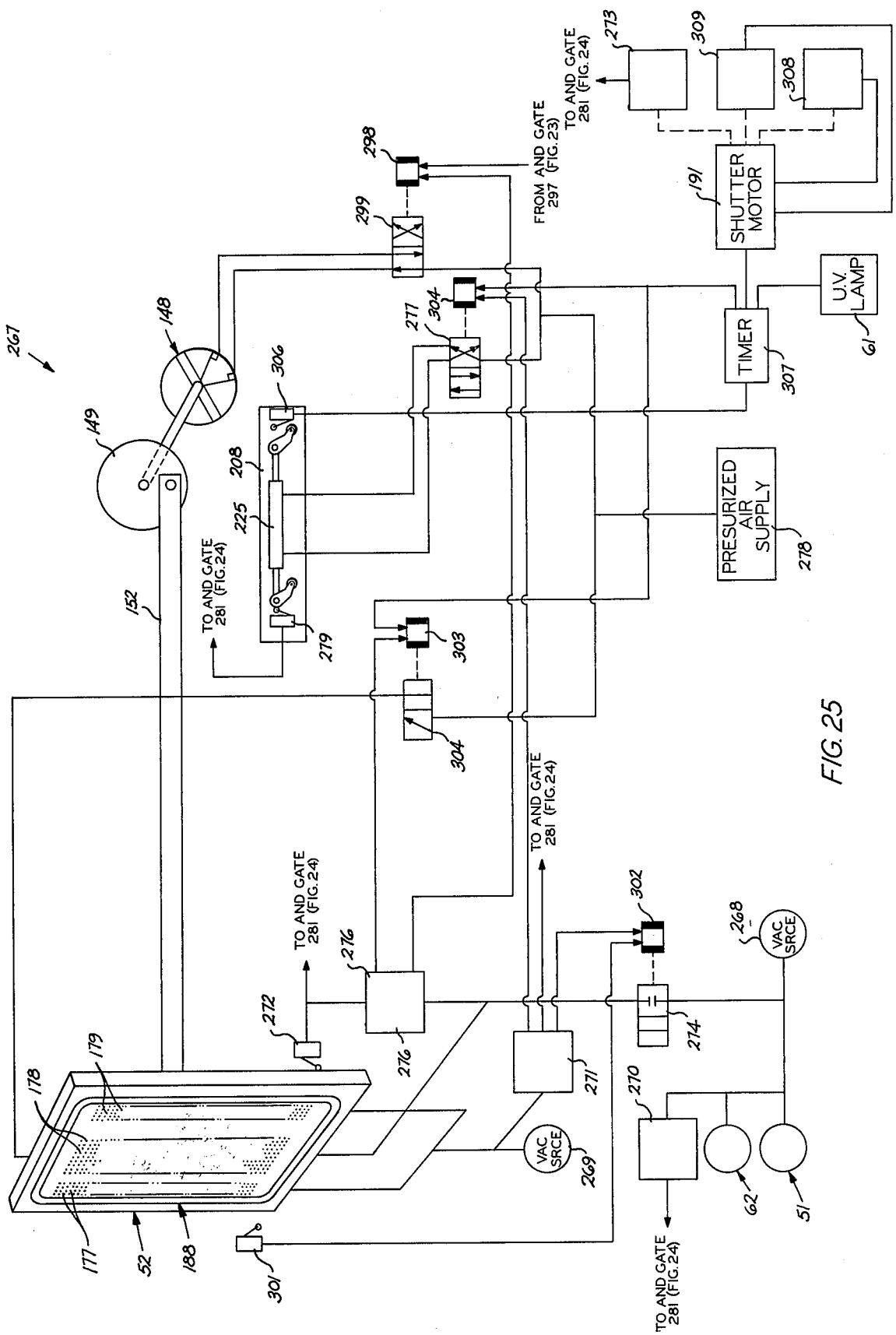
FIG. 25 is a combined electrical-pneumatic schematic for controlling the sequential operation of various components of the apparatus.

Referring now to FIG. 25, there is illustrated a combined electrical and pneumatic schematic designated generally by the numeral 267. After the flexible web 31 has been "threaded" through the apparatus 47, power is applied to a low vacuum source 268 and a high vacuum source 269. When power is applied to the low vacuum source 268, vacuum is applied to those portions of the vacuum gripping drums 51 and 62 adjacent to the vacuum shoe 83 (FIG. 4) as previously described. In addition, a vacuum operated "drum-vacuum" switch 270 is operated to indicate that vacuum is being applied to the drums 51 and 62. When power is applied to the high vacuum source 269, air is drawn through the openings 177 and 179 (FIG. 10) of the table 52. Since the seal 188 (FIG. 11) has not been inflated, no vacuum is developed at the apertures 177 and 179. In response to this condition, a "seal-vacuum" switch 271 is conditioned to provide indication that the seal is not inflated and that a vacuum has not developed at the apertures 177 and 179.

At this time, the table 52 is in the withdrawn or "out" position. While in the "out" position, the table 52 is in engagement with and closes a "table out" switch 272 to indicate that the table is to the right as viewed in FIG. 3. Further, the shutter door 193 (FIGS. 12 and 13) is closed. The shaft 192 (FIGS. 12 and 13) has a cam surface (not shown) which is in engagement with and conditions a "shutter position" switch 273 to indicate that the shutter door 193 is closed. A valve 274 is normally in a position to prevent vacuum from the low vacuum source 268 from being applied to the apertures 178 of the table 52. This conditions a "table vacuum" switch 276 to indicate that table vacuum for apertures 178 is not being applied. As noted above, the valve 277 is normally in position to provide pressurized air from the supply 278 to operate the air cylinder 225 to the extended position as illustrated in FIG. 16. In the extended position, the air cylinder 225 moves the support plates 209 and 211 to the right or "in" position as illustrated in FIG. 16. With the air cylinder 225 in the extended position, a "sensor in" switch 279 is closed to indicate that the light sensitive devices 57 are in position for the aligning operation of the apparatus 47.

As noted above, the switches 270, 271, 272, 273, 276 and 279 provide respective indication of vacuum being applied to the drums 51 and 62, the seal 188 being deflated and no vacuum at the table apertures 177 and 179, the table 52 being in the "out" position, the shutter 193 being in the closed position, no vacuum being applied to the table apertures 178 and the support plate 211 being in the "in" position. The switches 270, 271, 272, 273, 276 and 279 are connected to an AND gate 281, shown in FIG. 24, which collectively provide indication to the AND gate that all conditions for initial operation of the apparatus 47 have been satisfied.

Referring now to FIG. 24, with all of the foregoing conditions satisfied, a control switch 282 is closed and a signal is coupled from the AND gate 281 to a ramp generator 283 which develops a "start" signal. The "start" signal has an entry ramp which begins at zero volts and rises to a steady state at a prescribed voltage level. The "start" signal is coupled through a summing junction 284 to the power amplifier 266. The output of the power amplifier 266 is coupled through the armature 259c of the "adjust-run" switch 259 to a torque motor 286 to accelerate the motor. The motor 286 is coupled to and drives the vacuum gripping drum 62. As the drum 62 rotates, successive portions of the flexible web 31 are vacuumly gripped and the web is thereby advanced through the station 54 (FIG. 3).

As the motor 286 is operated, a tachometer generator 287, which is mechanically coupled to the motor, develops a signal representative of the rotational speed of the motor. The output of the tachometer generator 287 is capacitively coupled to a differentiator 288. The output of the differentiator 288 is coupled to a summing junction 289, through a power amplifier 291 to the motor 79 (FIG. 4). An adjustable voltage level is also coupled to the summing junction 289 by virtue of a potentiometer 292.

Use of the tachometer generator 287 and the differentiator 288 permits the motor 79 to track or follow the motor 286. This provides a driving force for the vacuum gripping drum 51 sufficient to relieve the flexible web 31 from having to furnish a pulling tension to accelerate the drum 51 when the drum 62 is rotated. A constant reverse tension in the flexible web 31 is established in this manner and, with respect to the portion of the web between the drums 51 and 61, assists in keeping the portion flat, helps prevent buckling and generates reverse movements of the portion if required in the alignment positioning process. The reverse tension is adjustable through the potentiometer 292.

Referring further to FIG. 24, as the flexible web 31 is moved through the station 54 (FIG. 3) successive portions of the web are moved therethrough. When the first section of the web containing one of the slots 36 enters the station 54, the slot ultimately passes over the window 45 in the pattern master 39. At the instant that the slot 36 is aligned with the window 45, light rays from one of the lamps 56 fall upon the phototransistor light sensitive device 57. In response to this light, the phototransistor light sensitive device 57 develops a voltage which is fed to the ramp generator 283. The ramp generator 283 responds and develops a trailing ramp of the "start" signal whereby the signal gradually decreases from the steady state voltage level to zero volts. The trailing ramp continues to be coupled through the summing junction 284, the power amplifier 266, the armature 259c to the torque motor 286. Upon the application of this decreasing voltage from the ramp generator 283, the torque motor 286 is decelerated to a much slower speed whereby the vacuum drums 51 and 62 cooperate to slowly bring the slot 36 of the flexible web 31 toward a position of general alignment over the corresponding photo diode light sensitive device 57 as illustrated in FIG. 24.

A "creep" operating potential is applied to the amplifier 264 through a potentiometer 285. This "creep" potential controls the amplifier 264 to provide sufficient operating potential for the torque motor 286 to "creep" and thereby move the flexible web 31, after the trailing ramp of the "start" signal has reached the zero volts level and before the slot 36 of the web overlies any portion of the window 43 of the pattern master 39.

When the slot 36 overlies any portion of the window 43 of the pattern master 39, as illustrated in phantom in FIG. 21, light rays from the corresponding lamp 56 passes through the aligned portions of the slot 36 and the window 43 and fall upon unequal portions of the segments 57a and 57b of the photo diode light sensitive device 57. Again, the light sensitive device 57 develops different voltage levels which are applied to the differential amplifier 264. The amplifier 264 responds to turn off the "creep" operating potential and develops a signal which is coupled through the summing junction 284, the power amplifier 266 and the armature 259c to the motor 286. This provides sufficient operating potential for the motor 286 even though the ramp generator 283 has now ceased to provide such operating potential. The operating potential provided through the differential amplifier 264 then controls the operation of the motor 286 to quickly position the section of the flexible web 31, in a "snap action" response, until the light rays from the lamp 56 fall upon equal surface portions of the segments 57a and 57b of the corresponding photo diode light sensitive device 57.

Referring to FIG. 21, the alignment of the slot 36 with the window 43, as described above, is accomplished by moving the flexible web 31 from left to right in FIG. 21. Initially the slot 36, as shown in phantom view, partially overlaps the window 43 to permit light rays from the corresponding lamp 56 (FIG. 19) to fall upon a portion of the segment 57a. This results in an operating potential being developed through the amplifier 264 and applied to the torque motor 286 for the "snap action" positioning of the section of the flexible web 31 to a position where the slot 36, as shown in solid view in FIG. 21, is aligned with the window 43 and the segments 57a and 57b.

Note that only the vertical centerlines of the slot 36 and the window 43 need be aligned at this time providing that equal amounts of light are falling upon the two segments 57a and 57b. For example, as illustrated in FIG. 21 in solid view, slot 36 is not centered with respect to the horizontal centerline of the window 43 but it is centered with respect to the vertical centerline. Thus, slot 36 is properly positioned to permit equal amounts of light to fall upon the segments 57a and 57b.

At this time the differential amplifier 264 stops providing operating potential for the motor 286. When the motor 286 is no longer operated, the tachometer generator 287 also stops and develops no voltage. When there is no voltage developed by the tachometer generator 287, a "zero rate" detector 293 develops a signal which represents that the flexible web 31 is in a "no advance" condition.

Referring now to FIG. 23, the signal developed by the "zero rate" detector 293 (FIG. 24) is coupled to a coil 258c of the switch 258 for closing the related armatures 258a and 258b. Since the armatures 259a and 259b of the "adjust-run" switch 259 have been previously manually set to the "run" position, the differential amplifier 256 is now connected to the positioning motor 129 and the differential amplifier 261 is now connected to the positioning motor 131.

When the flexible web 31 was moved into position to generally align the slot 36 of the web with the window 43 of the pattern master 39 as previously described, the slots 38a and 38b (FIGS. 1 and 19) of the web are also simultaneously generally aligned with the windows 44a and 44b (FIGS. 2 and 19) of the pattern master. At the time that this general alignment occurs, light rays pass from corresponding lamps 56 through the slots 38a and 38b, the windows 44a and 44b and onto the corresponding light sensitive devices 57. Voltages of different levels are developed by the light sensitive devices 57 in a manner previously described and are coupled to the differential amplifiers 256 and 261. However, the output signals from the amplifiers 256 and 261 are not coupled to the positioning motors 129 and 131, respectively, until the coil 258c is controlled by the "no advance" condition signal from the "zero rate" detector 293 (FIG. 24) as described above.

After the flexible web 31 has stopped and the "no advance" condition signal has been applied to the coil 258c, the armatures 258a and 258b are closed as previously described. The output signals from the differential amplifiers 256 and 261 are then applied to the positioning motors 129 and 131 to operate the motors. Upon operation of the motors 129 and 131, the carrier 92 (FIG. 7) is manipulated to position the pattern master 39 until the light rays emanating from the lamps 56 fall equally upon the segments 57a and 57b of the two corresponding light sensitive devices 57. At this time the differential amplifiers 256 and 261 no longer provide signals to the positioning motors 129 and 131 which thereby cease to operate.

As the slots 36, 38a and 38b of the flexible web 31 are being accurately aligned with the corresponding windows 43, 44a and 44b, respectively, of the pattern master 39, the art detail 42 of the pattern master is simultaneously being accurately positioned with respect to the prepunched through holes 34 formed through the flexible web. In addition, referring to FIG. 22, as the motors 129 and 131 adjust the carrier 92 to position the pattern master 39, the window 43 and the corresponding segments 57a and 57b are moved therewith so that the slot 36 is now centered in all respects with the window 43 and the segments. At this time, each of the slots 36, 38a and 38b will be aligned with the respective windows 43, 44a and 44b and the corresponding segments 57a and 57b in the identical manner as illustrated in FIG. 22 with respect to slot 36 and window 43. This represents the optimum condition.

A pair of null detectors 294 and 296 respond to the zero output of the differential amplifiers 256 and 261, respectively, and develop signals which are coupled to an AND gate 297. The AND gate 297 develops a signal which represents that the flexible web 31 is in the "no advance" condition and that the slots 36, 38a and 38b of the web are accurately aligned with the windows 43, 44a and 44b, respectively, of the pattern master 39.

Referring now to FIG. 25, the signal developed by the AND gate 297 is coupled to a solenoid 298 which controls the positioning of a valve 299 to permit pressurized air from the supply 278 to be applied to the rotary device 148. As described above, when the rotary device 148 is operated, the table 52 is moved to the left as viewed in FIGS. 3 and 25. Upon movement of the table 52, the table engages the prepositioned section of the flexible web 31 so that the web section extends from bottom to top of the table 52, as viewed in FIG. 10, and completely covers the apertures 178 and those portions of the inflatable seal 188 which are directly above and below the apertures 178. As the table 52 continues to move, the section of the flexible web 31 is ultimately moved into engagement with the pattern master 39 and in close proximity to the substrate 86. The rotary device 148 then ceases to operate and the table 52 is now in the "in" position.

As the table is moved to the left as viewed in FIG. 25, a "table in" switch 301 is closed to indicate that the table 52 is in position and in engagement with the prepositioned section of the flexible web 31. When the "table in" switch 301 is closed, a signal is coupled to a solenoid 302 which positions the valve 274 to apply a low vacuum from the vacuum source 268 to the chamber 174 (FIG. 10) and the corresponding apertures 178 whereby the prepositioned section of the flexible web 31 is gripped by the vacuum gripping table 52. As the vacuum is applied to the apertures 178, the "table vacuum" switch 276 is conditioned to indicate that the vacuum has been successfully applied. The condition of the switch 276 results in a signal being applied to a solenoid 303 which controls a valve 304 to facilitate the application of pressurized air from the supply 278 to the inflatable seal 188.

As the seal 188 is inflated, it extends from the slot 186 (FIG. 11) and would normally extend to a position as illustrated in phantom in FIG. 11. However, the flexible web 31 and the glass substrate 86 are adjacent to the inflating seal 188. Therefore, as the seal 188 inflates, the top and bottom portions of the seal are pressed against the adjacent top and bottom portions of the section of the flexible web 31 and the side or remaining portions of the seal are pressed against the substrate 86 which supports the pattern master 39 to thereby form an airtight enclosure which contains the interfacing portions of the flexible web and the pattern master.

As the inflatable seal 188 is inflated to form the airtight enclosure, a vacuum from the high vacuum source 269 develops and is applied through the apertures 177 and 179 of the vacuum gripping table 52 to vacuumly grip the adjacent portions of the substrate 86 which supports the pattern master 39. Even though the section of the flexible web 31 and the pattern master 39 have been moved into engagement with each other when the vacuum gripping table 52 was moved to the left as viewed in FIGS. 3 and 25, the application of the high vacuum within the airtight enclosure formed by the seal 188 results in a further urging together of the pattern master and the adjacent portions of the flexible web so that the pattern master and flexible web portions are in intimate contact.

As illustrated in FIG. 19, the pattern master 39 is mounted on the surface of the substrate 86 which is adjacent to the surface of the section of the flexible web 31 to be exposed to the ultraviolet lamp 61 (FIG. 12). When the section of flexible web 31 and the pattern master 39 are drawn into intimate contact within the airtight enclosure, the art detail 42 on the pattern master is positioned so close to the flexible web 31 that no shadows from the art detail will occur on the adjacent section of the flexible web. This permits precise exposure of those portions of the film 35 of the photoresist material which are to be developed and further permits precise definition of the outline of the ultimate printed circuit pattern of copper to be formed on the flexible printed circuit.

As the high vacuum is developed at the table 52, the "seal-vacuum" switch 271 is conditioned to indicate the application of such vacuum to the table. Upon the conditioning of the switch 271, a signal is developed and is coupled to a solenoid 305 which controls the valve 277 to reverse the application of pressurized air from the supply 278 to the air cylinder 225. Upon the reverse application of pressurized air to the cylinder 225, the rods 226 and 227, as viewed in FIG. 16, are moved downwardly to thereby move the bell crank cams 228 and 229. Since there is no longer a force to hold the rods 217 and 218 in the position as shown in FIG. 16, the support plate 209 moves to the left as viewed in FIG. 16 under the biasing action of the springs 223 and 224. In addition, the support plate 211 is also moved to the left with the support plate 209.

When the support plate 211 is moved to the left, critical portions of the accurately positioned pattern master 39 and the flexible web 31 are now in clear position for exposure to the ultraviolet lamp 61 (FIG. 12). Thus, while the critical positioning of the support plate 211 with respect to the aligning of the light sensitive devices 57 with the windows 43, 44a, 44b and 45 of the pattern master 39 is retained by virtue of the locked position of the adjusting motors 233, 239 and 244, the support plate 211 and the light sensitive devices can be removed from the exposure path of the ultraviolet lamp 61 to permit complete exposure of the circuit pattern master 39 and the adjacent section of the flexible web 31.

Referring again to FIG. 25, when the air cylinder 225 is operated in the reverse direction, a "sensor out" switch 306 is closed to indicate that the support plate 211 has been moved from the exposure path of the lamp 61 (FIG. 12). Upon the closure of the switch 306, a signal is developed and coupled to a timer 307. The timer 307 facilitates the application of high intensity potential to the ultraviolet lamp 61 which is continuously operating on a low intensity for warmup purposes. In addition, the timer 307 provides a signal to the shutter motor 191 (FIG. 12) to initiate rotation of the shaft 192 and the opening of the shutter door 193 as previously described. As the shutter motor 191 operates, a cam surface (not shown) on the shaft 192, closes a "forward rotational limit" switch 308 which couples a stop signal to the shutter motor 191 to stop operation of the motor. At this point, the shutter door 193 as viewed in FIG. 13, has been rotated through 180° and the ultraviolet lamp 61 is positioned within the opening 194 of the housing 59.

After a prescribed time established by the timer 307, another signal is directed to the shutter motor 191 to operate the motor in the reverse direction. After the shutter motor 191 has rotated the shutter door 193 through 180°, the door is again positioned as illustrated in FIG. 13. At this time another cam surface (not shown) on the shaft 192 engages a "reverse rotation limit" switch 309 which is closed to facilitate the coupling of a stop signal to the shutter motor 191 whereby the motor stops. In addition, the timer 307 reduces the operating potential applied to the ultraviolet lamp 61 to the low intensity operation.

As noted above, the shutter position switch 273 is controlled by a cam surface on the shaft 192 and normally provides a signal to the AND gate 281 (FIG. 24) when the shutter door 193 has closed the opening 194 of the housing 59.

When the timer 307 completes its cycle and has facilitated the control of the shutter motor 191 to close the shutter door 193, a signal is sent from the timer to the solenoid 305 whereby the valve 277 is positioned to apply pressurized air in the forward direction to the air cylinder 225. As the air cylinder 225 is operated in the forward direction, the cylinder moves the rods 226 and 227 to the position illustrated in FIG. 16 to return the support plate 211 and light sensitive devices 57 to the "in" position. At this time the "sensor out" switch 306 is opened and the "sensor in" switch 279 is closed.

When the switch 279 is closed, a signal is coupled to the solenoid 303 to move the valve 304 whereby the pressurized air is removed from the inflatable seal 188 and the seal deflates. As the seal deflates, the vacuum which had been developed at the apertures 177 and 179 of the table 52 dissipates. At this time the "seal-vacuum" switch 271 is conditioned to indicate that the seal has deflated and that no vacuum is being applied to the apertures 177 and 179.

Upon conditioning of the switch 271, a signal is coupled from the switch to the solenoid 302 to control the valve 274 to remove the vacuum from the apertures 178. This releases the gripped section of the flexible web 31 and conditions the "table vacuum" switch 276 to indicate the absence of the vacuum. At this time a signal is coupled from the switch 276 to the solenoid 298 whereby the valve 299 is controlled to reverse rotate the rotary device 148. As the rotary device 148 is rotated in the reverse direction, the table 52 is moved to the right (FIGS. 3 and 25). When the rotary device 148 has travelled through its control distance, the table 52 is located in the "out" position and is in engagement with the "table out" switch 272.

At this time the switches 270, 271, 272, 273, 276 and 279 are all now set to provide indication to the AND gate 281 (FIG. 24) to start the drive motors 79 and 286 whereby the next successive section of the flexible web 31 is advanced into the station 54 (FIG. 3). The cycle of operation is again repeated whereby the second successive section is exposed to the ultraviolet lamp 61. Successive sections of the flexible web 31 are processed through the station 54 in this manner and those sections are ultimately passed through station 72 so that the opposite side of the flexible web 31 can be treated in the same manner.

As an alternative to the use of the timer 307, a device which accumulates ultraviolet energy and charges a capacitor in response thereto is placed in the vicinity of the high intensity operation of the lamp 61 to respond to the exposure period. When the charge on the capacitor reaches a preselected level, representative of the required exposure time, a signal is developed which initiates the reverse procedure as described above.

As illustrated in FIG. 14, the support plate 211 provides support for a plurality of the light sensitive devices 57. These devices 57 are provided to accommodate circuits of different widths. For example, with the arrangement as illustrated, the light sensitive devices 57 and the physical dimensions of the apparatus 47 are capable of accommodating circuits having widths of 9", 15" or 21". In each case, the slot 36 of the flexible web 31 will be in the same central position to provide for the adjustment of the flexible web with respect to the window 43 of the pattern master 39. However, the slots in the flexible web 31 which correspond to the slots 38a and 38b would be aligned with the slots 38a and 38b but located different distances from the slot 36. The corresponding windows in the pattern master 39 would also be in a similar manner about the window 43.

Therefore, the apparatus 46 provides facility for establishing a precise and accurate alignment between the light sensitive devices 57 and the windows of the pattern master 39 by utilizing a portion of the system normally used to align the flexible web 31 with the pattern master.

In addition, facilities are provided for developing an airtight seal about the interfacing portions of the flexible web 31 and the pattern master 39 to insure precise definition of the ultimately developed printed circuit.

Still further, the apparatus provides facility for accurately aligning the pattern master 39 with the flexible web 31 and then removing the alignment facilities, for example, the light sensitive devices 57 to permit clear and complete exposure of the pattern master and the flexible web to the ultraviolet lamp 61 for the development of the exposed film 35 of photoresist material.

What is claimed is:

1. Apparatus for positioning a first element into aligned intimate contact with a second element, which comprises:
   means for moving the first element into a position spaced from and adjacent to the second element;
   means for precisely aligning the first element with the second element;
   means for gripping adjacent portions of the first element and moving the gripped portions of the first element toward and into interfacing engagement with the second element;
   means for selectively forming an airtight enclosure and for sealing within the airtight enclosure at least the interfacing engaging portions of the first and second elements; and
   means acting upon the portion of the first and second elements within the airtight enclosure for urging the engaging portions into intimate contact.

2. The apparatus as set forth in claim 1 wherein the means for precisely aligning includes:
   means for moveably supporting the second element; and
   means responsive to the positioning of the first element adjacent to the second element by the first element moving means for controlling the first element moving means and the second element supporting means to position the first and second elements in precise alignment.

3. The apparatus as set forth in claim 1 wherein the first element is formed with a plurality of slots and the second element is formed with a corresponding plurality of windows and the means for precisely aligning includes:
   a plurality of light sensitive devices;
   means for supporting the second element so that the plurality of windows thereof are aligned with respective ones of the plurality of light sensitive devices;
   a plurality of light emitting devices corresponding in number to the plurality of light sensitive devices;
   means for supporting the plurality of light emitting devices in general alignment with respective ones of the plurality of windows in the second element and of the plurality of light sensitive devices; and
   means responsive to the general alignment of the plurality of slots of the first element with respective ones of the plurality of light emitting devices, the plurality of windows of the second element and the plurality of light sensitive devices for controlling the first element moving means and the second element supporting means to position the first and second elements in precise alignment.

4. The apparatus as set forth in claim 3 which further comprises:
means for supporting the light sensitive devices in the position of alignment with the windows of the second element; and
means for moving the light sensitive devices supporting means to permit removal of the light sensitive devices and the corresponding supporting means after precise alignment of the first and second elements so that the aligned first and second elements are not overlapped by any portions of the light sensitive devices and the corresponding supporting means.

5. The apparatus as set forth in claim 4 which further comprises:
means responsive to the general alignment of the plurality of light emitting devices and respective ones of the plurality of windows of the second element and the plurality of light sensitive devices for moving the light sensitive devices supporting means to position the second element and the light sensitive devices in precise alignment.

6. The apparatus as set forth in claim 1 wherein the means for gripping and moving the first element includes:
a moveable table;
means formed in a surface of the table which engages the first element for developing a vacuum to grip the engaged first element; and
means for moving the table surface first into engagement with the first element and secondly moving the first element into interfacing engagement with the second element.

7. The apparatus as set forth in claim 1 wherein the means for forming the airtight enclosure includes:
an inflatable seal supported within the first element gripping and moving means and inflatable to form an airtight enclosure about at least the interfacing engaging portions of the first and second elements.

8. The apparatus as set forth in claim 7 wherein the urging means includes:
means, formed in the table surface which is located within a surface area uncovered by the first element, for developing a vacuum in the area to urge the second element further toward and into intimate contact with the first element.

9. Apparatus for positioning a first element having a plurality of slots formed therein at selected locations into aligned intimate contact with a second element having a plurality of windows formed therein at selected locations alignable with the slots of the first element, which comprises:
means for adjustably supporting the second element with the plurality of windows being generally in a selected position;
means for moveably transporting the first element into a position spaced from and adjacent to the second element with the plurality of slots being thereby generally alignable with the plurality of windows;
means responsive to the general alignment of the plurality of slots of the first element with the plurality of windows of the second element for controlling movement of the transporting means and adjustment of the supporting means to accurately align the slots and windows and thereby position the spaced first and second elements in precise alignment;
means responsive to the precise alignment of the first and second elements for gripping at least an adjacent portion of the first element and moving the gripped portion into interfacing engagement with the second element while retaining the precise alignment;
means responsive to the interfacing engagement of the first element with the second element for forming an airtight enclosure and for sealing within the airtight enclosure at least the interfacing engaging portions of the first and second elements; and
means responsive to the forming of the airtight enclosure and acting upon the portions of the first and second elements within the airtight enclosure for urging the interfacing engaging portions into intimate contact in the precise alignment.

10. The apparatus as set forth in claim 9 wherein portions of the means for supporting the second element are contained within the airtight enclosure and the urging means acts upon the contained portions to assist in urging the supported second element into intimate contact with the first element.

11. The apparatus as set forth in claim 9 wherein the controlling means includes:
a plurality of sensing devices for sensing the general alignment of the plurality of slots of the first element with the plurality of windows of the second element; and
means for supporting the plurality of sensing devices in overlapping alignment with at least the portions of the first and second elements which contain the pluralities of slots and windows, respectively;
and the apparatus further comprises:
means responsive to the urging of the first and second elements into intimate contact for moving the plurality of sensing devices and corresponding supporting means away from overlapping alignment with any portions of the first and second element.

12. The apparatus as set forth in claim 9 wherein the supporting means for the second element includes:
a transparent substrate which supports the second element on at least portions of one flat surface thereof adjacent to the position whereat the first element is to be located;
means for supporting the substrate for adjusting movement; and
means for moving the supporting means under selective control by the controlling means.

13. The apparatus as set forth in claim 9 wherein the controlling means includes:
a first sensing device, aligned with a first selected one of the plurality of windows of the second element and responsive to the passage of a first selected one of the plurality of slots of the first element, for controlling the transporting means to slow the speed of movement of the first element adjacent to the second element;
a second sensing device, aligned with a second selected one of the plurality of windows and responsive to the general alignment of the first selected slot with the second selected window, for controlling the transporting means to move the first element until the first selected slot is in precise alignment with the second selected window and to stop the transporting means thereafter; and
a third sensing device, aligned with a third selected one of the plurality of windows and responsive to the general alignment of a second selected one of the plurality of slots with the third selected window, for controlling the second element supporting means to move the second element until the second selected slot is in precise alignment with the third selected window.

14. The apparatus as set forth in claim 9 wherein the controlling means includes:
   a first sensing device;
   a second sensing device; and
   means for adjustably supporting the first and second sensing devices in general alignment with first and second selected ones, respectively, of the plurality of windows; and the apparatus further comprises:
   first means, located adjacent to the first sensing device and responsive to the general alignment of the first sensing device with the first selected window, for adjustably moving the sensing devices supporting means to position the first sensing device in precise alignment with the first selected window; and
   second means, located adjacent to the second sensing device and responsive to the general alignment of the second sensing device with the second selected window, for adjustably moving the sensing devices supporting means to position the second sensing device in precise alignment with the second selected window.

15. The apparatus as set forth in claim 14 wherein the means for supporting the first and second sensing devices includes:
   a first support plate for supporting the sensing devices thereon; and the first and second means for adjustably moving the sensing devices supporting means includes:
   a second support plate spaced from the first support plate;
   means for normally urging the first and second support plates toward each other;
   means mounted on the second support plate and in engagement with the first support plate for moving the first support plate in cooperation with the urging means and relative to the second plate; and
   means for retaining the first and second support plates in alignment.

16. The apparatus as set forth in claim 9 wherein the gripping and moving means includes:
   a table mounted for movement;
   means for moving the table to position at least a portion of one surface of the table into interfacing engagement with the first element and for moving the first element into interfacing engagement with the second element; and
   means formed in the portion of the one surface of the table for developing a vacuum thereat to grip the engaged first element as the first element is being moved toward and into engagement with the second element.

17. The apparatus as set forth in claim 16 wherein the means for forming the airtight enclosure includes:
   an endless slot formed in the one surface of the table;
   an endless inflatable tube seal positioned and contained completely within the endless slot in the deflated condition; and
   means responsive to the interfacing engagement of the first element with the second element for inflating the seal so that portions of the seal extend from the slot to position those portions completely about the interfacing engaged portions of the first and second elements and thereby form the airtight enclosure.

18. The apparatus as set forth in claim 17 wherein the urging means includes:
   means, formed in other portions of the one surface of the table and positioned adjacent to portions of the second element supporting means, for developing a vacuum to urge the other portions of the table surface toward the table and thereby urge the interfacing engaged portions of the first and second elements into intimate contact.

* * * * *